US012652915B2

(12) United States Patent
Park et al.

(10) Patent No.: US 12,652,915 B2
(45) Date of Patent: Jun. 9, 2026

(54) DISPLAY DEVICE

(71) Applicant: Samsung Display Co., LTD., Yongin-si (KR)

(72) Inventors: Hyungjun Park, Yongin-si (KR); Wonkyu Kwak, Yongin-si (KR); Yanghee Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 399 days.

(21) Appl. No.: 18/506,750

(22) Filed: Nov. 10, 2023

(65) Prior Publication Data

US 2024/0306453 A1    Sep. 12, 2024

(30) Foreign Application Priority Data

Mar. 7, 2023    (KR) ........................ 10-2023-0029909

(51) Int. Cl.
*H10K 59/131*    (2023.01)

(52) U.S. Cl.
CPC .................................. *H10K 59/131* (2023.02)

(58) Field of Classification Search
None
See application file for complete search history.

(56) References Cited

U.S. PATENT DOCUMENTS

| | | | | |
|---|---|---|---|---|
| 2016/0172428 A1* | 6/2016 | Song | .................... | H10K 59/131 |
| | | | | 257/40 |
| 2016/0179229 A1* | 6/2016 | Ahn | ........................ | G06F 3/0412 |
| | | | | 345/173 |
| 2017/0194411 A1* | 7/2017 | Park | ..................... | H10K 59/873 |
| 2024/0194103 A1* | 6/2024 | Hwang | .................. | G09G 3/006 |

FOREIGN PATENT DOCUMENTS

| | | | | | |
|---|---|---|---|---|---|
| CN | 108564886 A | * | 9/2018 | ............. | G09F 9/301 |
| CN | 109148418 A | * | 1/2019 | ............. | H01L 22/32 |
| CN | 112820759 A | * | 5/2021 | ....... | H10K 59/80524 |
| CN | 112992925 A | * | 6/2021 | ............. | H10K 59/87 |
| CN | 117524020 A | * | 2/2024 | ............. | G09G 3/006 |
| KR | 10-0623705 B1 | | 9/2006 | | |
| KR | 10-2015-0009792 A | | 1/2015 | | |

* cited by examiner

*Primary Examiner* — Michael Lebentritt
(74) *Attorney, Agent, or Firm* — Womble Bond Dickinson (US) LLP

(57) ABSTRACT

A display device includes a substrate including a display area, a pad area where pads are positioned, and a bending area positioned between the display area and the pad area in a plan view; a test line part on the substrate in the pad area adjacent to the bending area, and to which a first constant voltage is applied; a (1-1)-th power line on the substrate in the pad area, adjacent to the test line part in a second direction crossing the first direction, and to which the first constant voltage is applied; a (2-1)-th power line between the (1-1)-th power line and the pads in the plan view, and to which a second constant voltage different from the first constant voltage is applied; and a (1-2)-th power line between the (2-1)-th power line and pads in the plan view, and to which the first constant voltage is applied.

20 Claims, 10 Drawing Sheets

NDA：PA,BA,PDA

NDA:PA,BA,PDA

TSS:SEP1,SCP,CS,SEP2

ESDP : ESDH-1,ESDH-2,ESDL-1,DCN,TR1,TR2
DL : DL-1,DL-2
TR1 : TR1-1,TR1-2
TR2 : TR2-1,TR2-2

ESDP : ESDH-1, ESDH-2, ESDH-3, ESDL-1, ESDL-2

ESDP : ESDH-1 , ESDH-2 , ESDH-3 , ESDL-1 , ESDL-2 , DCN , TR1 , TR2
DL : DL-1 , DL-2 , DL-3 , DL-4
TR1 : TR1-1 , TR1-2
TR2 : TR2-1 , TR2-2

NDA:PA,BA,PDA

ESDP : ESDH, ESDL, DCN, TR1, TR2
TR1 : TR1-1, TR1-2
TR2 : TR2-1, TR2-2

DISPLAY DEVICE

CROSS-REFERENCE TO RELATED APPLICATION

This application claims priority to and the benefit of Korean Patent Application No. 10-2023-0029909, filed on Mar. 7, 2023, in the Korean Intellectual Property Office, the content of which is herein incorporated by reference in its entirely.

BACKGROUND

1. Field

Aspects of the present disclosure relates to a display device. More particularly, the present disclosure relates to a display device that provides visual information.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device or the like is increasing.

When a pulse potential caused by electrostatic discharge ("ESD") is input to a display device from the outside, display quality may be deteriorated due to noise or malfunction of an internal circuit may occur in the display device. To solve this problem, the display device may include an electrostatic protection part that protects the internal circuit from the pulse potential caused by electrostatic discharge.

The above information disclosed in this Background section is only for enhancement of understanding of the background of the invention and therefore it may contain information that does not form the prior art.

SUMMARY

Aspects of embodiments of the present disclosure are directed to a display device with suppressed corrosion defects.

According to some embodiments of the present disclosure, there is provided a display device including: a substrate including a display area, a pad area where a plurality of pads are positioned, and a bending area positioned between the display area and the pad area in a plan view; a test line part on the substrate in the pad area adjacent to the bending area, extending along a first direction, and to which a first constant voltage is applied; a (1-1)-th power line on the substrate in the pad area, adjacent to the test line part in a second direction crossing the first direction, extending along the first direction, and to which the first constant voltage is applied; a (2-1)-th power line between the (1-1)-th power line and the plurality of pads in the plan view, extending along the first direction, and to which a second constant voltage different from the first constant voltage is applied; and a (1-2)-th power line between the (2-1)-th power line and the plurality of pads in the plan view, extending along the first direction, and to which the first constant voltage is applied.

In some embodiments, the first constant voltage has a positive voltage level, and the second constant voltage has a negative voltage level.

In some embodiments, the display device further includes: a data line on the substrate in the display area and extending along the second direction; and a connection electrode connecting the data line and one of the (1-1)-th power line and the (1-2)-th power line, and connecting the data line and the (2-1)-th power line.

In some embodiments, the connection electrode is connected to the (1-1)-th power line or the (1-2)-th power line through a first transistor, and is connected to the (2-1)-th power line through a second transistor.

In some embodiments, the first transistor includes a first electrode connected to the (1-1)-th power line or the (1-2)-th power line, a gate electrode connected to the (1-1)-th power line or the (1-2)-th power line, and a second electrode connected to the connection electrode, and the second transistor includes a first electrode connected to the connection electrode, a gate electrode connected to the connection electrode, and a second electrode connected to the (2-1)-th power line.

In some embodiments, the first transistor includes a (1-1)-th transistor and a (1-2)-th transistor, the second transistor includes a (2-1)-th transistor and a (2-2)-th transistor, the (1-1)-th transistor and the (1-2)-th transistor are connected in series with each other, and the (2-1)-th transistor and the (2-2)-th transistor are connected in series with each other.

In some embodiments, the first constant voltage has a positive voltage level, and the second constant voltage is a ground voltage.

In some embodiments, the display device further includes: a (2-2)-th power line between the (1-2)-th power line and the plurality of pads in the plan view, extending along the first direction, and to which the second constant voltage is applied; and a (1-3)-th power line between the (2-2)-th power line and the plurality of pads in the plan view, extending along the first direction, and to which the first constant voltage is applied.

In some embodiments, the first constant voltage has a positive voltage level, and the second constant voltage has a negative voltage level.

In some embodiments, the display device of claim 8, further includes: a data line on the substrate in the display area and extending along the second direction; and a connection electrode connecting the data line to one of the (1-1)-th power line, the (1-2)-th power line, and the (1-3)-th power line, and connecting the data line to one of the (2-1)-th power line and the (2-2)-th power line.

In some embodiments, the connection electrode is connected to one of the (1-1)-th power line, the (1-2)-th power line, and the (1-3)-th power line through a first transistor and is connected to the (2-1)-th power line or the (2-2)-th power line through a second transistor.

In some embodiments, the first transistor includes a first electrode connected to one of the (1-1)-th power line, the (1-2)-th power line, and the (1-3)-th power line, a gate electrode connected to one of the (1-1)-th power line, the (1-2)-th power line, and the (1-3)-th power line, and a second electrode connected to the connection electrode, and the second transistor includes a first electrode connected to the connection electrode, a gate electrode connected to the connection electrode, and a second electrode connected to the (2-1)-th power line or the (2-2)-th power line.

In some embodiments, the first transistor includes a (1-1)-th transistor and a (1-2)-th transistor, the second transistor includes a (2-1)-th transistor and a (2-2)-th transistor, the (1-1)-th transistor and the (1-2)-th transistor are connected in series with each other, and the (2-1)-th transistor and the (2-2)-th transistor are connected in series with each other.

In some embodiments, the first constant voltage has a positive voltage level, and the second constant voltage is a ground voltage.

According to some embodiments of the present disclosure, there is provided a display device including: a substrate including a display area, a pad area where a plurality of pads are positioned, and a bending area positioned between the display area and the pad area in a plan view; a first test line part on the substrate in the pad area adjacent to the bending area, extending along a first direction, and to which a first constant voltage is applied; a first power line on the substrate in the pad area, adjacent to the first test line part in a second direction crossing the first direction, extending along the first direction, and to which the first constant voltage is applied; a second power line between the first power line and the plurality of pads in the plan view, extending along the first direction, and to which a second constant voltage different from the first constant voltage is applied; a second test line part between the second power line and the plurality of pads in the plan view, extending along the first direction, and to which the first constant voltage is applied; a data line on the substrate in the display area and extending along the second direction; and a connection electrode connecting the data line and the first power line, and connecting the data line and the second power line.

In some embodiments, the connection electrode is connected to the first power line through a first transistor and is connected to the second power line through a second transistor, the first transistor includes a (1-1)-th transistor and a (1-2)-th transistor, the second transistor includes a (2-1)-th transistor and a (2-2)-th transistor, the (1-1)-th transistor and the (1-2)-th transistor are connected in series with each other, and the (2-1)-th transistor and the (2-2)-th transistor are connected in series with each other.

In some embodiments, the first transistor includes a first electrode connected to the first power line, a gate electrode connected to the first power line, and a second electrode connected to the connection electrode, and the second transistor includes a first electrode connected to the connection electrode, a gate electrode connected to the connection electrode, and a second electrode connected to the second power line.

In some embodiments, a separation distance in the plan view between the second test line part and the second power line is greater than a separation distance in the plan view between the first test line part and the first power line.

In some embodiments, the first constant voltage has a positive voltage level, and the second constant voltage has a negative voltage level.

In some embodiments, the first constant voltage has a positive voltage level, and the second constant voltage is a ground voltage.

Accordingly, a separation distance in a plan view between the (1-1)-th power line and the connection electrode may be relatively increased. A separation distance in a plan view between the (2-1)-th power line and the connection electrode may be relatively increased. As a result, corrosion defects that occur when the (1-1)-th power line and the connection electrode are adjacent or when the (2-1)-th power line and the connection electrode are adjacent may be suppressed or substantially reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
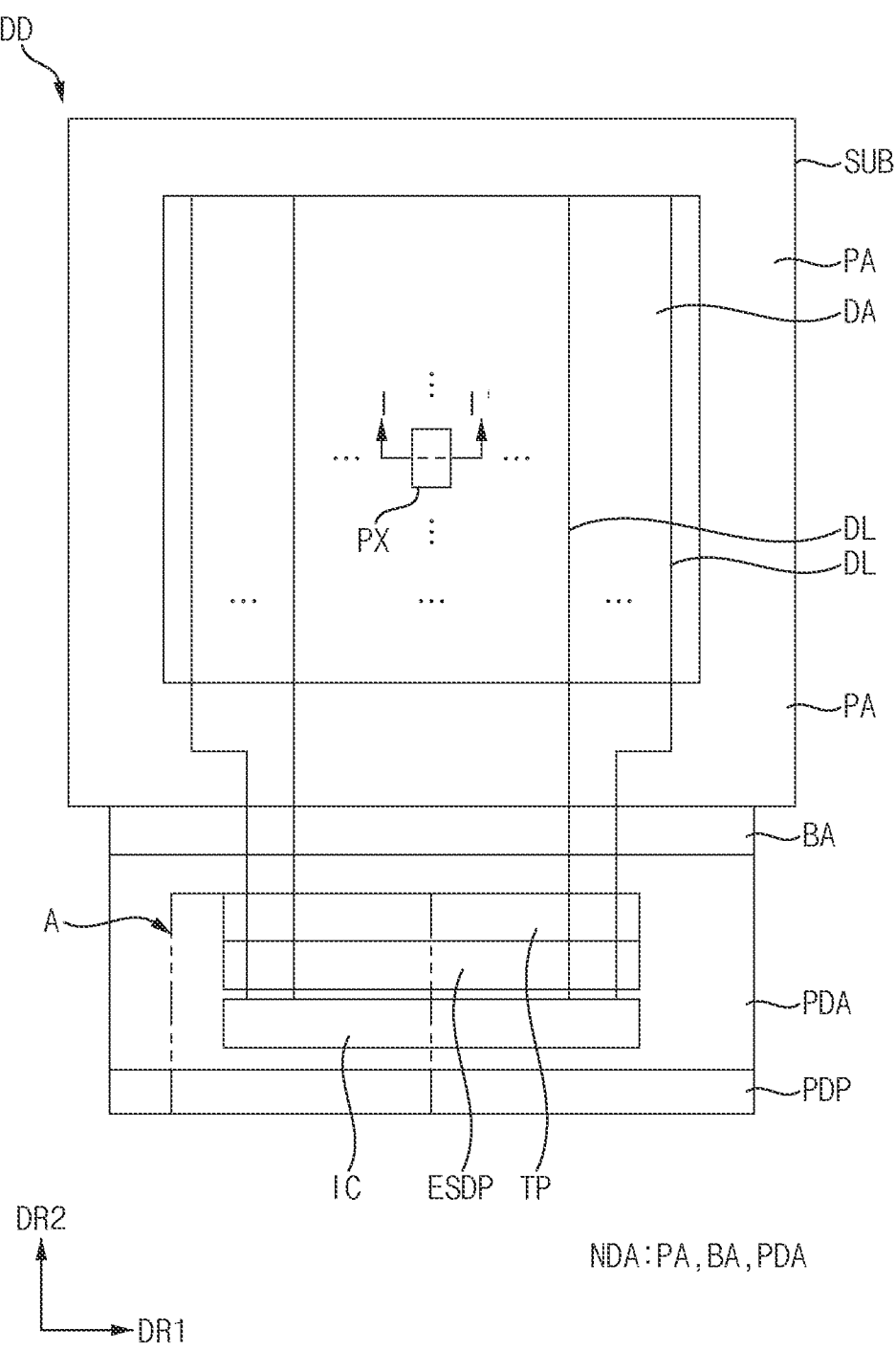
FIG. 1 is a plan view illustrating a display device according to some embodiments of the present disclosure.

Hereinafter, embodiments of the present disclosure will be described in detail with reference to the accompanying drawings. The same reference numerals are used for the same components in the drawings, and redundant descriptions of the same components will be omitted.

Figure 2:
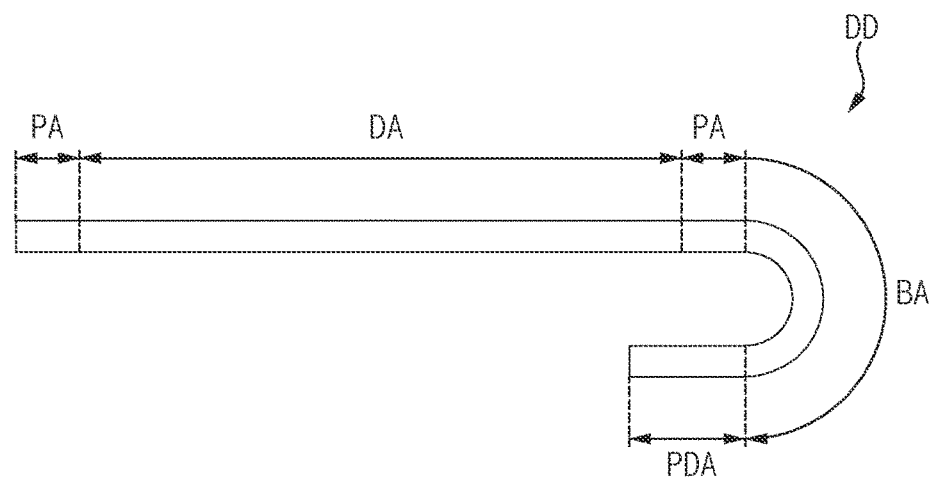
FIG. 2 is a diagram illustrating a bent shape of the display device of FIG. 1, according to some embodiments of the present disclosure.

FIG. 1 is a plan view illustrating a display device according to some embodiments of the present disclosure. FIG. 2 is a diagram illustrating a bent shape of the display device of FIG. 1, according to some embodiments of the present disclosure.

In this disclosure, a plane may be defined by a first direction DR1 and a second direction DR2 crossing the first direction DR1. For example, the first direction DR1 and the second direction DR2 may be perpendicular to each other. The display device DD and various components or layers thereof may have a thickness extended along a third direction which crosses or intersects the plane that is defined by the first direction DR1 and the second direction DR2.

Referring to FIG. 1, the display device DD according to some embodiments of the present disclosure may include a substrate SUB, a test line part TP, an electrostatic protection part ESDP, a driving chip IC, a pad part PDP, and data lines DL.

The substrate SUB may include a display area DA and a non-display area NDA. The display area DA may be defined as an area capable of displaying an image by generating light or adjusting transmittance of light provided from an external light source. A plurality of pixels PX may be disposed in the display area DA. The pixels PX may generate light according to a driving signal. The pixels PX may be repeatedly arranged along the first and second directions DR1 and DR2.

The data lines DL connected to the pixels PX may be further disposed on the substrate SUB in the display area DA. In addition, gate lines, light emitting control lines, and the like connected to the pixels PX may be disposed on the substrate SUB in the display area DA.

The data lines DL may extend along the second direction DR2 and may be disposed along the first direction DR1 on the substrate SUB in the display area DA. Each of the data lines DL may be electrically connected to the driving chip IC. In addition, each of the data lines DL may be electrically connected to the electrostatic protection part ESDP. A detailed description thereof will be described later with reference to FIGS. 5 and 6.

The non-display area NDA may be defined as an area not displaying an image. The non-display area NDA may include a peripheral area PA, a bending area BA, and a pad area PDA.

The peripheral area PA may be positioned around the display area DA. For example, the peripheral area PA may partially or entirely surround the display area DA.

As illustrated in FIG. 2, the bending area BA may extend from one side of the peripheral area PA and may be bent downward. That is, when the display device DD is bent at the bending area BA about a bending axis extending along the first direction DR1, the pad area PDA may be positioned on the bottom surface of the display device DD. The pad area PDA may extend from the bending area BA and be positioned under the display area DA or the peripheral area PA.

As illustrated in FIG. 1, in the display device DD which is unfolded, the bending area BA may be positioned between the display area DA and the pad area PDA. That is, the display area DA, the peripheral area PA, the bending area BA, and the pad area PA may be in order.

The pad part PDP may be disposed on the substrate SUB in the pad area PDA. The pad part PDP may include a plurality of pads. The pad part PDP may be electrically connected to the driving chip IC or a printed circuit board. In addition, the pad part PDP may be electrically connected to a high voltage line (e.g., a high voltage line VGHL in FIG. 5) and a low voltage line (e.g., a low voltage line VGLL in FIG. 5). Accordingly, the pad part PDP may provide a first constant voltage to the high voltage line and a second constant voltage, which is different from the first constant voltage, to the low voltage line. A detailed description thereof will be described later with reference to FIG. 5.

The driving chip IC may be disposed on the substrate SUB in the pad area PDA. The driving chip IC may convert a digital data signal of the driving signals into an analog data signal and provide the converted analog data signal to the pixels PX. For example, the driving chip IC may be a data driver.

The test line part TP may be disposed on the substrate SUB in the pad area PDA. For example, the test line part TP may be adjacent to the bending area BA. For example, the test line part TP may include lines for inspecting (e.g., identifying) open and short states (e.g., open circuit and short circuit states) of the data lines DL. For another example, the test line part TP may include lines for inspecting (e.g., identifying) defects such as cracks occurring at the non-display area NDA. However, the present disclosure is not limited thereto, and the test line part TP may include various lines for inspecting defects of the display device DD.

The electrostatic protection part ESDP may be disposed on the substrate SUB in the pad area PDA. The electrostatic protection part ESDP may be adjacent to the test line part TP in the second direction DR2. For example, the electrostatic protection part ESDP may be disposed between the test line part TP and the pad part PDP in a plan view. The electrostatic protection part ESDP may prevent a pulse potential caused by electrostatic discharge ("ESD") from flowing into an internal circuit (e.g., a pixel circuit), or substantially reduce instances thereof.

Figure 5:
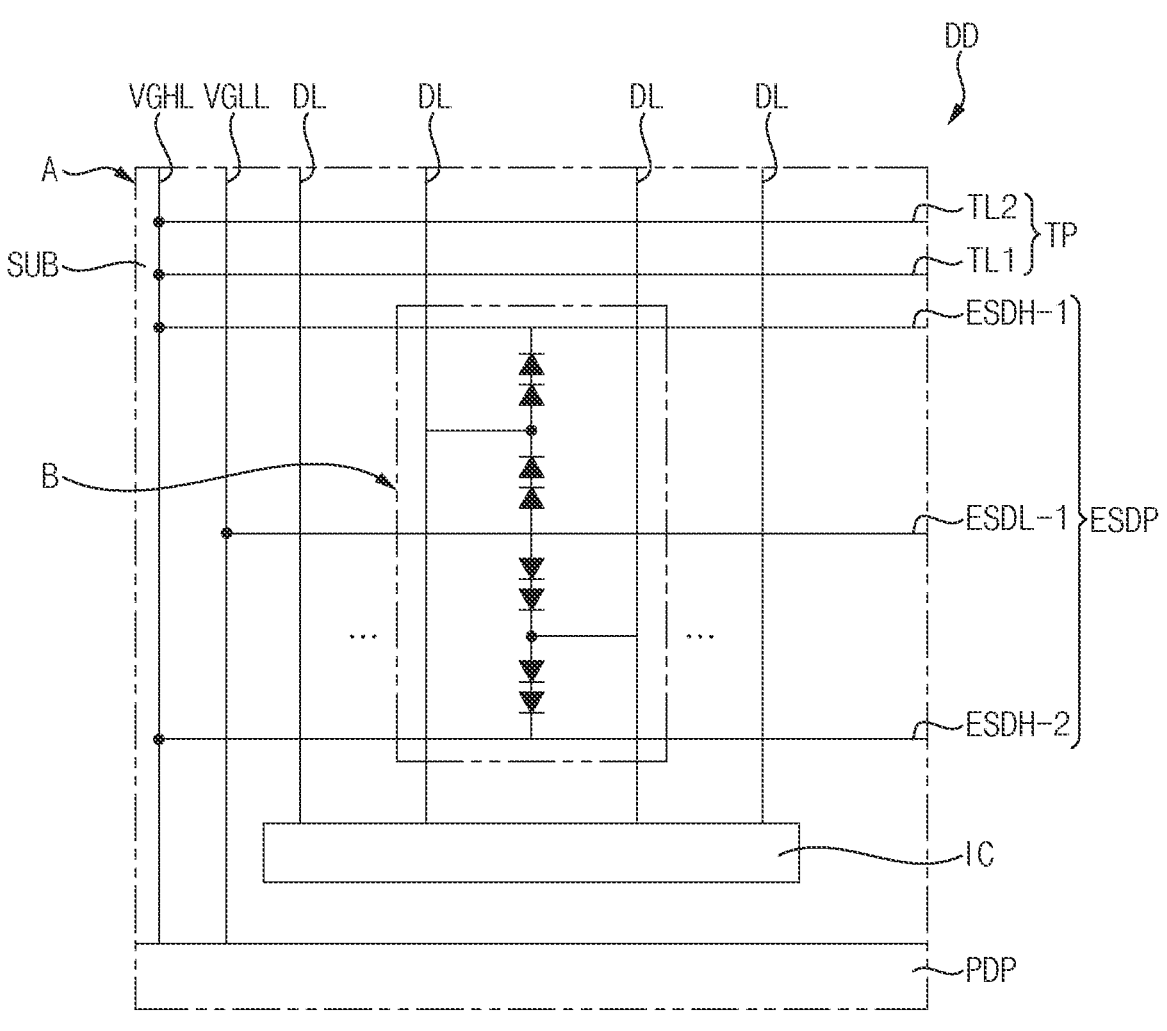
FIG. 5 is an enlarged plan view of the area 'A' of FIG. 1, according to some embodiments of the present disclosure.
Figure 5:

The electrostatic protection part ESDP may include a (1-1)-th power line (e.g., a (1-1)-th power line ESDH-1 of FIG. 5) and a (1-2)-th power line (e.g., a (1-2)-th power line ESDH-2 of FIG. 5), and a second power line (e.g., the second power line ESDL-1 of FIG. 5). A detailed description thereof will be described later with reference to FIGS. 5 and 6.

Figure 3:
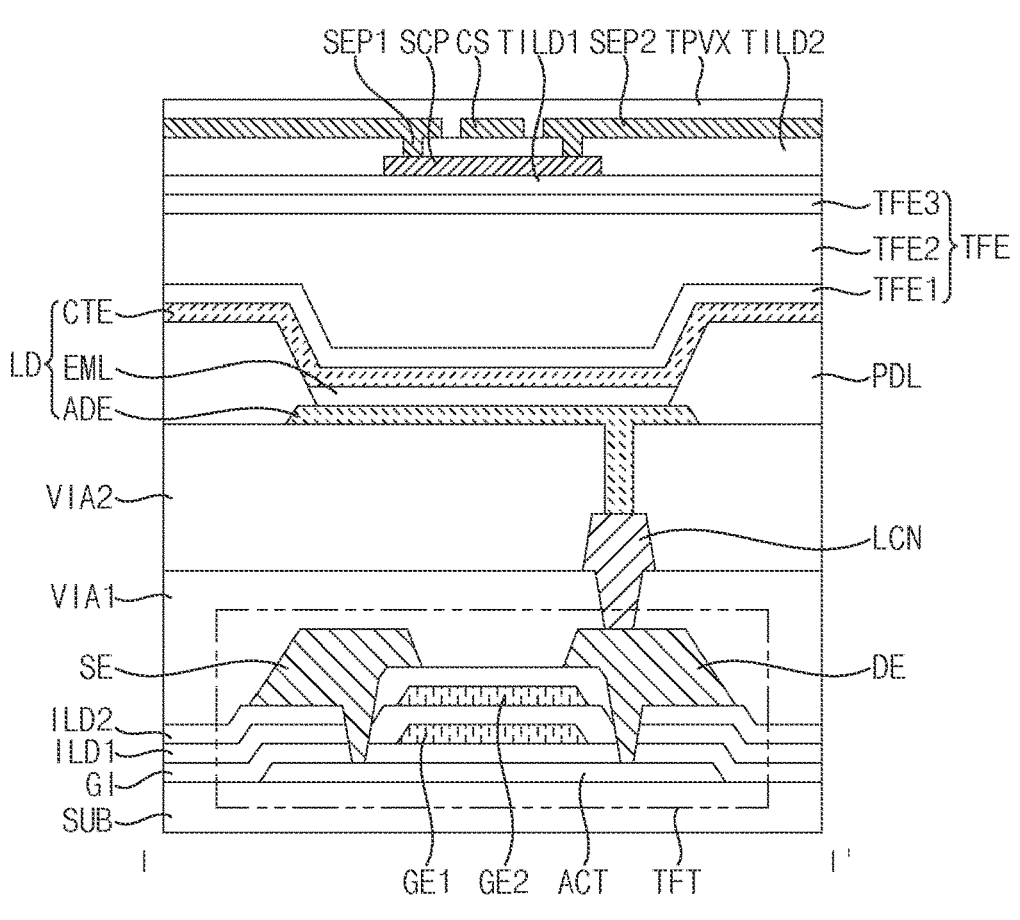
FIG. 3 is a cross-sectional view taken along the line I-I' of FIG. 1, according to some embodiments of the present disclosure.
Figure 4:
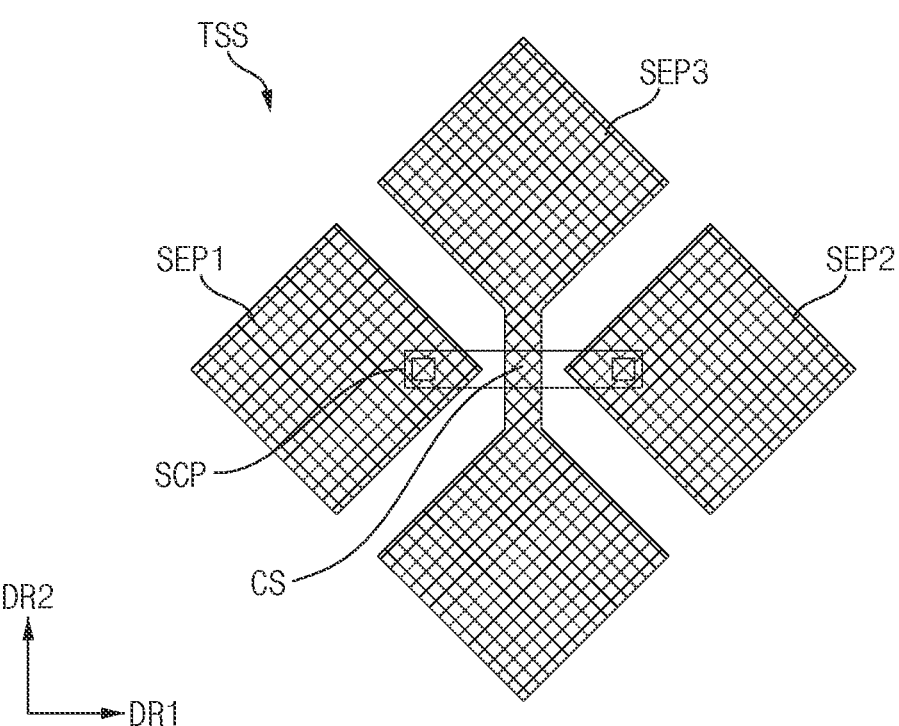
FIG. 4 is a plan view illustrating a touch sensing structure included in the display device of FIG. 3, according to some embodiments of the present disclosure.

FIG. 3 is a cross-sectional view taken along the line I-I' of FIG. 1, according to some embodiments of the present disclosure. FIG. 4 is a plan view illustrating a touch sensing structure included in the display device of FIG. 3, according to some embodiments of the present disclosure.

Referring to FIGS. 3 and 4, the display device DD according to some embodiments of the present disclosure may include the substrate SUB, a gate insulating layer GI, a first inter-layer insulating layer ILD1, a second inter-layer insulating layer ILD2, a thin film transistor TFT, a first via-insulating layer VIA1, a second via-insulating layer VIA2, a light emitting element connection electrode LCN, a pixel defining layer PDL, a light emitting element LD, an encapsulation layer TFE, a touch sensing structure TSS, a first touch insulating layer TILD1, a second touch insulating layer TILD2, and a touch protection layer TPVX.

The thin film transistor TFT may include an active layer ACT, a first gate electrode GE1, a second gate electrode GE2, a source electrode SE and a drain electrode DE. The light emitting element LD may include a lower electrode ADE, a light emitting layer EML, and an upper electrode CTE. The touch sensing structure TSS may include a sensing connection pattern SCP, a first sensing electrode pattern SEP1, a second sensing electrode pattern SEP2, and a connection part CS.

The substrate SUB may include a transparent material or an opaque material. The substrate SUB may be formed of a transparent resin substrate. A polyimide substrate may be an example of the transparent resin substrate. In this case, the polyimide substrate may include a first organic layer, a first barrier layer, a second organic layer, and/or the like. In some examples, the substrate SUB may include a quartz substrate, a synthetic quartz substrate, a calcium fluoride substrate, a fluorine-doped quartz substrate, a soda-lime glass substrate, a non-alkali glass substrate, and/or the like. These may be used alone or in combination with each other.

A buffer layer may be disposed on the substrate SUB. The buffer layer BUF may prevent or substantially reduce diffusion of metal atoms or impurities from the substrate SUB to an upper structure (e.g., the thin film transistor TFT, the light emitting element LD, etc.). In addition, the buffer layer BUF may serve to improve (e.g., increase) flatness of the surface of the substrate SUB when the surface of the substrate SUB is not uniform. For example, the buffer layer BUF may include an organic insulating material or an inorganic insulating material. In some examples, the buffer layer BUF may be omitted.

The active layer ACT may be disposed on the substrate SUB. The active layer ACT may include an oxide semiconductor, a silicon semiconductor, an organic semiconductor, and/or the like. For example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), zinc (Zn), and the like. The silicon semiconductor may include amorphous silicon, polycrystalline silicon, and/or the like. The active layer ACT may include a source area, a drain area, and a channel area positioned between the source area and the drain area.

The gate insulating layer GI may be disposed on the substrate SUB. The gate insulating layer GI may cover the active layer ACT on the substrate SUB and may be disposed along the profile of the active layer ACT with a uniform or substantially uniform thickness. In some examples, the gate insulating layer GI may sufficiently cover the active layer ACT on the substrate SUB, and may have a substantially flat upper surface without creating a step difference around the active layer ACT. The gate insulating layer GI may include an inorganic material. Examples of the inorganic material that may be used as the gate insulating layer GI may include silicon oxide ($SiO_x$), silicon nitride ($SiN_x$), silicon oxynitride ($SiO_xN_y$), or the like. These may be used alone or in combination with each other.

The first gate electrode GE1 may be disposed on the gate insulating layer GI. The first gate electrode GE1 may overlap the channel area of the active layer ACT. The first gate electrode GE1 may include a metal, an alloy, a metal nitride, a conductive metal oxide, a transparent conductive material, and/or the like. Examples of material that may be used as the first gate electrode GE1 may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The first inter-layer insulating layer ILD1 may be disposed on the gate insulating layer GI. The first inter-layer insulating layer ILD1 may cover the first gate electrode GE1 on the gate insulating layer GI and may be disposed along the profile of the first gate electrode GE1 with a uniform or substantially uniform thickness. In some examples, the first inter-layer insulating layer ILD1 may sufficiently cover the first gate electrode GE1 on the gate insulating layer GI, and may have a substantially flat upper surface without creating a step difference around the first gate electrode GE1. The first inter-layer insulating layer ILD1 may include an inorganic material. Examples of the inorganic material that may be used as the first inter-layer insulating layer ILD1 may include silicon oxide ($SiO_x$), silicon nitride ($SiN_x$), silicon oxynitride ($SiO_xN_y$), or the like. These may be used alone or in combination with each other.

The second gate electrode GE2 may be disposed on the first inter-layer insulating layer ILD1. The second gate electrode GE2 may overlap the first gate electrode GE1 in a plan view. For example, the second gate electrode GE2 may include a metal, an alloy, a metal nitride, a conductive metal oxide, a transparent conductive material, or the like. These may be used alone or in combination with each other.

The second inter-layer insulating layer ILD2 may be disposed on the first inter-layer insulating layer ILD1. The second inter-layer insulating layer ILD2 may cover the second gate electrode GE2 on the first inter-layer insulating layer ILD1 and may be disposed along the profile of the second gate electrode GE2 with a uniform or substantially uniform thickness. In some examples, the second inter-layer insulating layer ILD2 may sufficiently cover the second gate electrode GE2 on the first inter-layer insulating layer ILD1, and may have a substantially flat upper surface without creating a step difference around the second gate electrode GE2. The second inter-layer insulating layer ILD2 may include an inorganic material. Examples of the inorganic material that may be used as the second inter-layer insulating layer ILD2 may include silicon oxide ($SiO_x$), silicon nitride ($SiN_x$), silicon oxynitride ($SiO_xN_y$), or the like. These may be used alone or in combination with each other.

The source electrode SE and the drain electrode DE may be disposed on the second inter-layer insulating layer ILD2. The source electrode SE may be connected to the source area of the active layer ACT through a contact hole formed by removing first portions of the gate insulating layer GI, the first inter-layer insulating layer ILD1, and the second inter-layer insulating layer ILD2. The drain electrode DE may be connected to the drain area of the active layer ACT through a contact hole formed by removing second portions of the gate insulating layer GI, the first inter-layer insulating layer ILD1, and the second inter-layer insulating layer ILD2. Each of the source electrode SE and the drain electrode DE may include a metal, an alloy, a metal nitride, a conductive metal oxide, a transparent conductive material, or the like. These may be used alone or in combination with each other.

Accordingly, the thin film transistor TFT including the active layer ACT, the first gate electrode GE1, the second gate electrode GE2, the source electrode SE, and the drain electrode DE may be formed.

The first via-insulating layer VIA1 may be disposed on the second inter-layer insulating layer ILD2. For example, the first via-insulating layer VIA1 may be disposed on the second inter-layer insulating layer ILD2 with a relatively thick thickness to sufficiently cover the source electrode SE and the drain electrode DE. The first via-insulating layer VIA1 may include an organic material. Examples of the organic material that may be used as the first via-insulating layer VIA1 may include photoresist, polyacryl-based resin, polyimide-based resin, polyamide-based resin, siloxane-based resin, acryl-based resin, epoxy-based resin, or the like. These may be used alone or in combination with each other.

The light emitting element connection electrode LCN may be disposed on the first via-insulating layer VIA1. The light emitting element connection electrode LCN may be connected to the drain electrode DE through a contact hole penetrating the first via-insulating layer VIA1 in the third direction. Accordingly, the light emitting element connection electrode LCN may electrically connect the thin film transistor TFT and the light emitting element LD. For example, the light emitting element connection electrode LCN may include a metal, an alloy, a metal nitride, a conductive metal oxide, a transparent conductive material, or the like. These may be used alone or in combination with each other.

The second via-insulating layer VIA2 may be disposed on the first via-insulating layer VIA1. For example, the second via-insulating layer VIA2 may be disposed on the first via-insulating layer VIA1 with a relatively thick thickness to sufficiently cover the light emitting element connection electrode LCN. The second via-insulating layer VIA2 may include an organic material. Examples of the organic material that may be used as the second via-insulating layer VIA2 may include photoresist, polyacryl-based resin, polyimide-based resin, polyamide-based resin, siloxane-based resin, acryl-based resin, epoxy-based resin, or the like. These may be used alone or in combination with each other.

The lower electrode ADE may be disposed on the second via-insulating layer VIA2. The lower electrode ADE may be connected to the light emitting element connection electrode LCN through a contact hole penetrating the second via-insulating layer VIA2 in the third direction. The lower electrode ADE may include a metal, an alloy, a metal nitride, a conductive metal oxide, a transparent conductive material, or the like. These may be used alone or in combination with each other. For example, the lower electrode ADE may serve as an anode electrode.

The pixel defining layer PDL may be disposed on the second via-insulating layer VIA2. The pixel defining layer PDL may cover an edge of the lower electrode ADE and may expose a portion of an upper surface of the lower electrode ADE. The pixel defining layer PDL may include an organic material and/or an inorganic material. Examples of the organic material that may be used as the pixel defining layer PDL may include photoresist, polyacryl-based resin, polyimide-based resin, polyamide-based resin, siloxane-based resin, epoxy-based resin, or the like. These may be used alone or in combination with each other.

The light emitting layer EML may be disposed on the lower electrode ADE. For example, the light emitting layer EML may be disposed on the lower electrode ADE, which may be at least partially exposed. The light emitting layer EML may include an organic material that emits light of a set or predetermined color. For example, the light emitting layer EML may be formed using at least one of light emitting materials capable of emitting red light, green light, and blue light according to the type of a sub-pixel. For another example, the light emitting layer EML may emit white light as a whole by stacking a plurality of light emitting materials capable of generating different color lights such as red light, green light, and blue light.

The upper electrode CTE may be disposed on the pixel defining layer PDL and the light emitting layer EML. The upper electrode CTE may include a metal, an alloy, a metal nitride, a conductive metal oxide, a transparent conductive material, or the like. These may be used alone or in combination with each other. For example, the upper electrode CTE may serve to as a cathode electrode.

Accordingly, the light emitting element LD including the lower electrode ADE, the light emitting layer EML, and the upper electrode CTE may be formed.

The encapsulation layer TFE may be disposed on the upper electrode CTE. The encapsulation layer TFE may include a first inorganic encapsulation layer TFE1, an organic encapsulation layer TFE2, and a second inorganic encapsulation layer TFE3.

The first inorganic encapsulation layer TFE1 may be disposed on the upper electrode CTE. The first inorganic encapsulation layer TFE1 may cover the upper electrode CTE and may be disposed along the profile of the upper electrode CTE with a uniform or substantially uniform thickness. The first inorganic encapsulation layer TFE1 may prevent the light emitting element LD from being deteriorated due to penetration of moisture, oxygen, or the like, or substantially reduce such deterioration. In addition, the first inorganic encapsulation layer TFE1 may protect the light emitting element LD from external impact. For example, the first inorganic encapsulation layer TFE1 may include a flexible inorganic material.

The organic encapsulation layer TFE2 may be disposed on the first inorganic encapsulation layer TFE1. The organic encapsulation layer TFE2 may improve (e.g., increase) flatness of the display device DD. The organic encapsulation layer TFE2 may protect the light emitting element LD together with the first inorganic encapsulation layer TFE1. For example, the organic encapsulation layer TFE2 may include a flexible organic material.

The second inorganic encapsulation layer TFE3 may be disposed on the organic encapsulation layer TFE2. The second inorganic encapsulation layer TFE3 may cover the organic encapsulation layer TFE2 and may be disposed along the profile of the organic encapsulation layer TFE2 with a uniform thickness. The second inorganic encapsulation layer TFE3 may prevent the light emitting element LD from being deteriorated due to penetration of moisture, oxygen, or the like together with the first inorganic encapsulation layer TFE1, or substantially reduce instances thereof. In addition, the second inorganic encapsulation layer TFE3 may protect the light emitting element LD from external impact together with the first inorganic encapsulation layer TFE1 and the organic encapsulation layer TFE2. For example, the second inorganic encapsulation layer TFE3 may include a flexible inorganic material.

In some examples, the encapsulation layer TFE may have a five-layer structure in which three inorganic encapsulation layers and two organic encapsulation layers are stacked or have a seven-layer structure in which four inorganic encapsulation layers and three organic encapsulation layers are stacked.

The first touch insulating layer TILD1 may be disposed on the second inorganic encapsulation layer TFE3. For example, the first touch insulating layer TILD1 may include an inorganic material or an organic material.

The sensing connection pattern SCP may be disposed on the first touch insulating layer TILD1. As illustrated in FIG. 4, the sensing connection pattern SCP may electrically connect the first sensing electrode pattern SEP1 and the second sensing electrode pattern SEP2 through contact holes. For example, the sensing connection pattern SCP may include the same material as the first sensing electrode pattern SEP1 and the second sensing electrode pattern SEP2. The sensing connection pattern SCP may include a metal, an alloy, a metal nitride, a conductive metal oxide, a transparent conductive material, or the like. These may be used alone or in combination with each other.

The second touch insulating layer TILD2 may be disposed on the first touch insulating layer TILD1. The second touch insulating layer TILD2 may sufficiently cover the sensing connection pattern SCP. For example, the second touch insulating layer TILD2 may include an inorganic material or an organic material.

Figure 7:
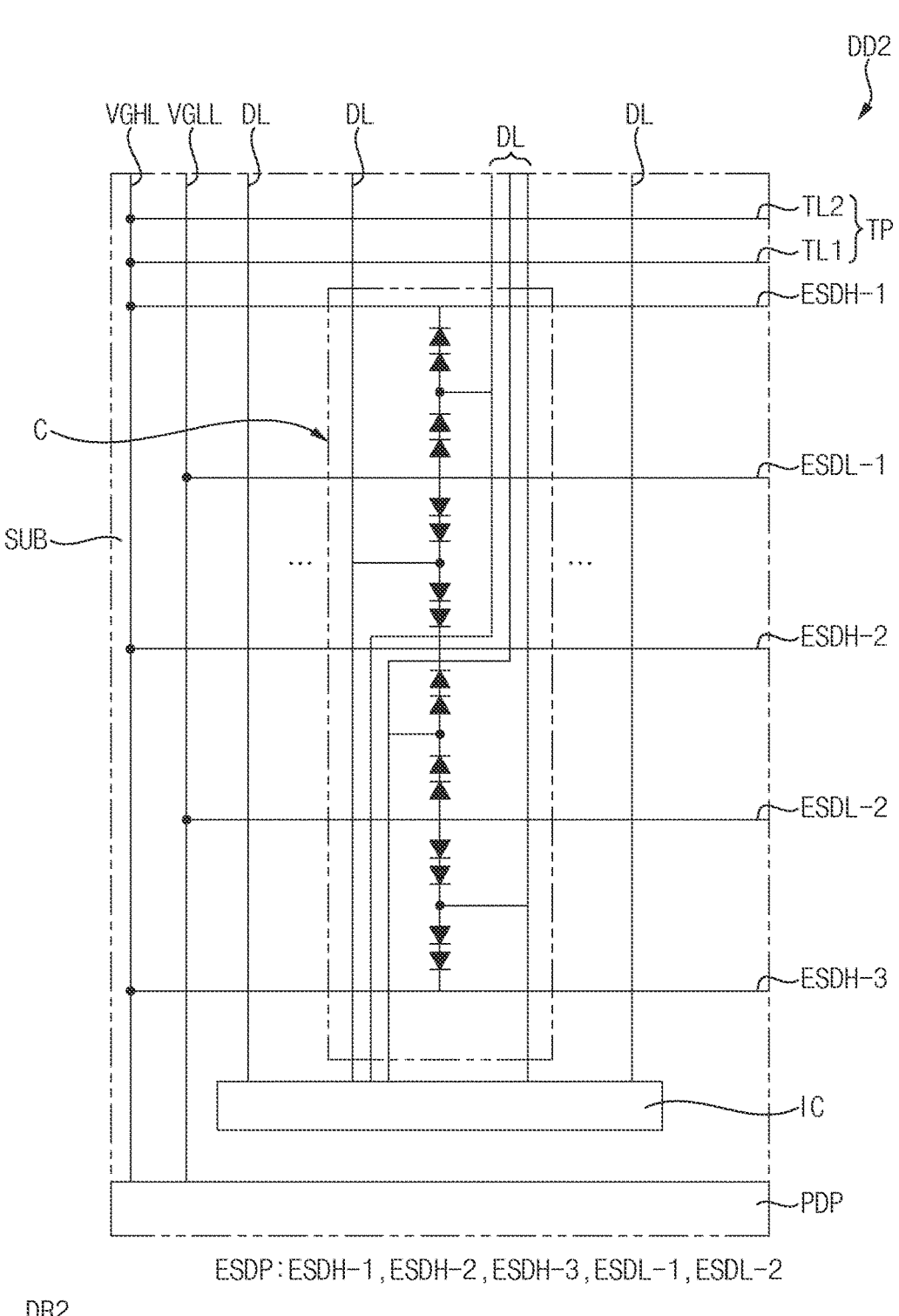
FIG. 7 is a plan view illustrating a display device according to some other embodiments of the present disclosure.

The first sensing electrode pattern SEP1, the second sensing electrode pattern SEP2, and the connection part CS may be disposed on the second touch insulating layer TILD2. In addition, as illustrated in FIG. 7, a third sensing electrode pattern SEP3 may be disposed on the second touch insulating layer TILD2. In this case, the third sensing electrode pattern SEP3 may be disposed on the same layer as the connection part CS. For example, each of the first sensing electrode pattern SEP1, the second sensing electrode pattern SEP2, the third sensing electrode pattern SEP3, and the connection part CS may include carbon nanotube (CNT), transparent conductive oxide, indium tin oxide (ITO), indium gallium zinc oxide (IGZO), zinc oxide (ZnO), graphene, silver nanowire (AgNW), copper (Cu), chromium (Cr), titanium (Ti), aluminum (Al), and/or the like. These may be used alone or in combination with each other.

The touch protection layer TPVX may be disposed on the second touch insulating layer TILD2, the first sensing electrode pattern SEP1, the second sensing electrode pattern SEP2, and the connection part CS. The touch protection layer TPVX may sufficiently cover the first sensing electrode pattern SEP1, the second sensing 1 electrode pattern SEP2, and the connection portion CS. For example, the touch protection layer TPVX may include an inorganic material or an organic material.

The touch sensing structure TSS of the present disclosure is not limited to the structure illustrated in FIGS. 3 and 4 and may have various suitable known structures. For example, the first sensing electrode pattern SEP1 and the second sensing electrode pattern SEP2 may be disposed on a different layer from the third sensing electrode pattern SEP3, such that the first sensing electrode pattern SEP1 and the second sensing electrode pattern SEP2 may have a continuous structure without the sensing connection pattern SCP.

Although the display device DD of the present disclosure is described as utilizing the organic light emitting display device ("OLED"), the configuration of the present disclosure is not limited thereto. In other embodiments, the display device DD may include a liquid crystal display device ("LCD"), a field emission display device ("FED"), a plasma display device ("PDP"), an electrophoretic image display device ("EPD"), an inorganic light emitting display device ("ILED"), a quantum dot display device, or the like.

Figure 6:
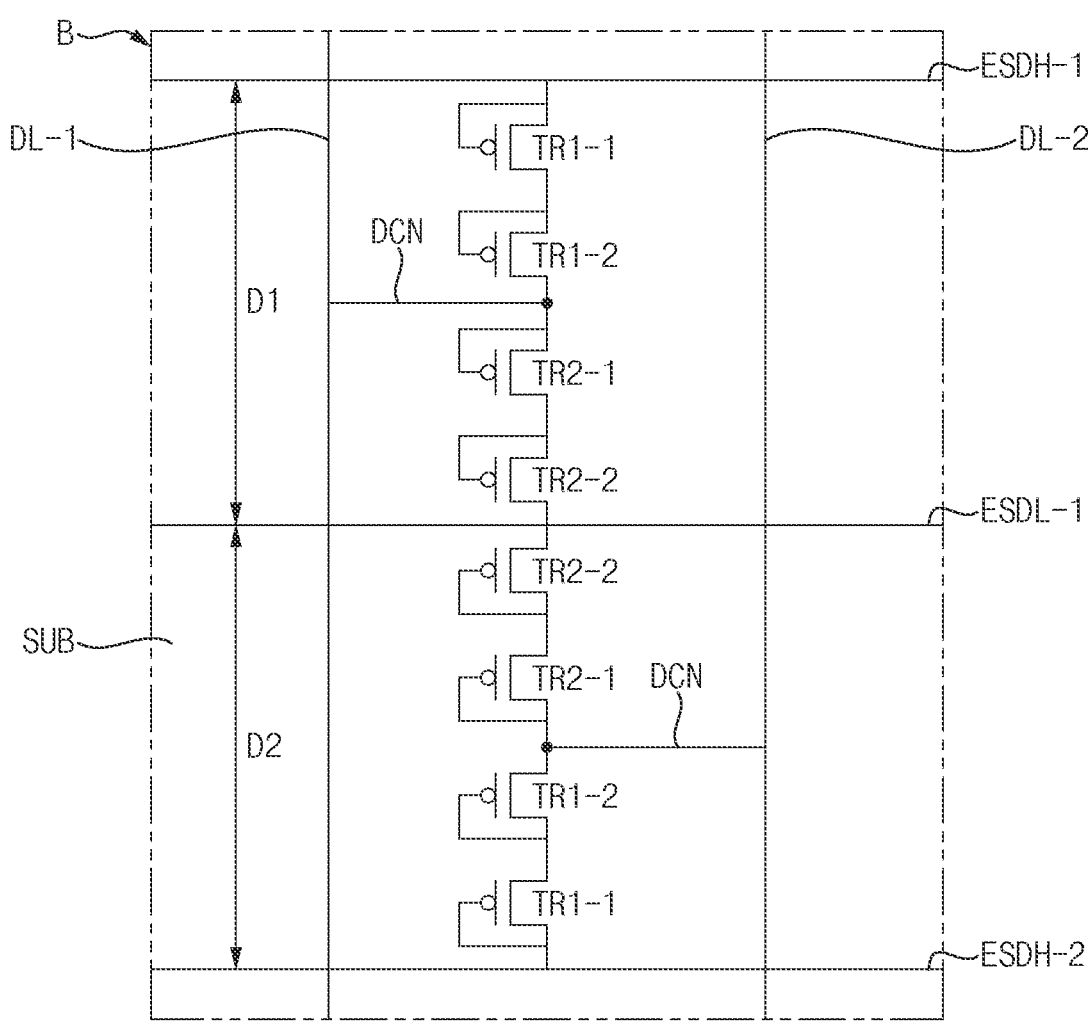
FIG. 6 is an enlarged plan view of the area 'B' of FIG. 5, according to some embodiments of the present disclosure.

FIG. 5 is an enlarged plan view of the area 'A' of FIG. 1, according to some embodiments of the present disclosure. FIG. 6 is an enlarged plan view of the area 'B' of FIG. 5, according to some embodiments of the present disclosure.

Referring to FIGS. 5 and 6, the display device DD according to some embodiments of the present disclosure may include the substrate SUB, the test line part TP, the electrostatic protection part ESDP, the driving chip IC, the pad part PDP, a high voltage line VGHL, a low voltage line VGLL, and the data lines DL in the pad area (e.g., the pad area PDA of FIG. 1).

The high voltage line VGHL may be disposed on the substrate SUB in the pad area and may extend along the second direction DR2. The high voltage line VGHL 1 may be electrically connected to the pad part PDP. Accordingly, the high voltage line VGHL may receive a first constant voltage from the pad part PDP.

The low voltage line VGLL may be disposed on the substrate SUB in the pad area and may extend along the second direction DR2. The low voltage line VGLL may be spaced apart (e.g., separated/offset) from the high voltage line VGHL in the first direction DR1. The low voltage line VGLL may be electrically connected to the pad part PDP. Accordingly, the low voltage line VGLL may receive a second constant voltage, which is different from the first constant voltage, from the pad part PDP.

In some embodiments, the first constant voltage may have a positive voltage level, and the second constant voltage may have a negative voltage level.

The test line part TP may be disposed on the substrate SUB in the pad area and may extend along the first direction DR1. For example, the test line part TP may be adjacent to the bending area (e.g., the bending area BA of FIG. 1). The test line part TP may be electrically connected to the high voltage line VGHL. Accordingly, the test line part TP may receive the first constant voltage from the high voltage line VGHL.

The test line part TP may include a first test line TL1 and a second test line TL2.

The first test line TL1 may be disposed on the substrate SUB in the pad area and may extend along the first direction DR1. For example, the first test line TL1 may be disposed between the second test line TL2 and a (1-1)-th power line ESDH1-1 in a plan view. The first test line TL1 may receive the first constant voltage from the high voltage line VGHL.

For example, the first test line TL1 may be a line for inspecting (e.g., identifying) open and short states (e.g., open circuit and short circuit states) of the data lines DL. However, the present disclosure is not limited thereto, and the first test line TL1 may be a line for inspecting (e.g., identifying) other defects of the display device DD.

As illustrated in FIG. 5, the first test line TL1 may be one line. However, the present disclosure is not limited thereto, and there may be a plurality of first test lines TL1.

The second test line TL2 may be disposed on the substrate SUB in the pad area and may extend along the first direction DR1. The second test line TL2 may be adjacent to the bending area. That is, the second test line TL2 may be disposed between the bending area and the first test line TL1 in a plan view. The second test line TL2 may receive the first constant voltage from the high voltage line VGHL. For example, the second test line TL2 may be a line for inspecting (e.g., identifying) defects such as cracks occurring at the non-display area (e.g., the non-display area NDA of FIG. 1). However, the present disclosure is not limited thereto, and the second test line TL2 may be a line for inspecting (e.g., identifying) other defects of the display device DD.

As illustrated in FIG. 5, the second test line TL2 may be one line. However, the present disclosure is not limited thereto, and there may be a plurality of second test lines TL2.

The electrostatic protection part ESDP may be disposed on the substrate SUB in the pad area. The electrostatic protection part ESDP may be adjacent to the test line part TP in the second direction DR2. For example, the electrostatic protection part ESDP may be disposed between the test line part TP and the pad part PDP in a plan view. The electrostatic protection part ESDP may include the (1-1)-th power line ESDH-1, a (1-2)-th power line ESDH-2, and a second power line ESDL-1.

The (1-1)-th power line ESDH-1 may be disposed on the substrate SUB in the pad area and may extend along the first direction DR1. The (1-1)-th power line ESDH-1 may be electrically connected to the high voltage line VGHL. Accordingly, the (1-1)-th power line ESDH-1 may receive the first constant voltage from the high voltage line VGHL.

In some embodiments, the (1-1)-th power line ESDH-1 may be adjacent to the test line part TP in the second direction DR2. That is, the (1-1)-th power line ESDH-1 may be adjacent to the first test line TL1 in the second direction DR2. For example, the (1-1)-th power line ESDH-1 may be disposed between the first test line TL1 and the second power line ESDL-1 in a plan view. Accordingly, the test line part TP to which the first constant voltage is applied and the (1-1)-th power line ESDH-1 to which the first constant voltage is applied may be disposed adjacent to each other. In other words, the test line part TP and the (1-1)-th power line ESDH-1, to which the same voltage is applied, may be disposed adjacent to each other.

The second power line ESDL-1 may be disposed on the substrate SUB in the pad area and may extend along the first direction DR1. The second power line ESDL-1 may be electrically connected to the low voltage line VGLL. Accordingly, the second power line ESDL-1 may receive the second constant voltage from the low voltage line VGLL.

In some embodiments, the second power line ESDL-1 may be disposed between the (1-1)-th power line ESDH-1 and the pad part PDP in a plan view. That is, the second power line ESDL-1 may be disposed between the (1-1)-th power line ESDH-1 and the plurality of pads in a plan view. For example, the second power line ESDL-1 may be disposed between the (1-1)-th power line ESDH-1 and the (1-2)-th power line ESDH-2 in a plan view. Accordingly, the test line part TP to which the first constant voltage is applied and the second power line ESDL-1 to which the second constant voltage is applied may be spaced apart (e.g., separated/offset) by a set or predetermined distance. In other words, the test line part TP and the second power line ESDL-1, to which different voltages are applied, may be spaced apart (e.g., separated/offset) by a set or predetermined distance.

The (1-2)-th power line ESDH-2 may be disposed on the substrate SUB in the pad area and may extend along the first direction DR1. The (1-2)-th power line ESDH-2 may be electrically connected to the high voltage line VGHL. Accordingly, the (1-2)-th power line ESDH-2 may receive the first constant voltage from the high voltage line VGHL.

The (1-2)-th power line ESDH-2 may be disposed between the second power line ESDL-1 and the pad part PDP in a plan view. That is, the (1-2)-th power line ESDH-2 may be disposed between the second power line ESDL-1 and the plurality of pads in a plan view.

That is, the electrostatic protection part ESDP may be arranged in an order of the (1-2)-th power line ESDH-2, the second power line ESDL-1, and the (1-1)-th power line ESDH-1 along the second direction DR2 from the pad part PDP.

Moisture or the like may penetrate into a display device through the bending area on the substrate SUB. In this case, corrosion of the lines may occur in an area with large potential difference between adjacent lines. For example, corrosion may occur in an area adjacent to the test line part TP to which the first constant voltage is applied and the second power line ESDL-1 to which the second constant voltage is applied.

To prevent or substantially reduce the corrosion of the lines, in the display device DD according to some embodiments of the present disclosure, the test line part TP to which the first constant voltage is applied and the (1-1)-th power line ESDH-1 to which the first constant voltage is applied may be disposed adjacent to each other. In addition, the test line part TP to which the first constant voltage is applied and the second power line ESDL-1 to which the second constant voltage is applied may be spaced apart (e.g., separated/offset) by a set or predetermined distance. Accordingly, corrosion defects that occur when the test line part TP and the second power line ESDL-1 are adjacent may be suppressed or substantially reduced.

The data lines DL may be disposed on the substrate SUB in the pad area. The data lines DL may extend along the second direction DR2 and may be disposed along the first direction DR1. The data lines DL may be electrically connected to the driving chip IC. Accordingly, the data lines DL may receive a data voltage from the driving chip IC.

As illustrated in FIG. 6, the data lines DL may include first data lines DL-1 and second data lines DL-2. In addition, the electrostatic protection part ESDP may further include a data connection electrode DCN, a first transistor TR1, and a second transistor TR2.

The data connection electrode DCN may be disposed on the substrate SUB in the pad area. The data connection electrode DCN may be electrically connected to each of the data lines DL. Accordingly, the data connection electrode DCN may receive the data voltage from each of the data lines DL.

Each of the first data lines DL-1 may be electrically connected to the (1-1)-th power line ESDH-1 through the data connection electrode DCN. In addition, each of the first data lines DL-1 may be electrically connected to the second power line ESDL-1 through the data connection electrode DCN.

Each of the second data lines DL-2 may be electrically connected to the (1-2)-th power line ESDH-2 through the data connection electrode DCN. In addition, each of the second data lines DL-2 may be electrically connected to the second power line ESDL-1 through the data connection electrode DCN.

The data connection electrode DCN may be electrically connected to the (1-1)-th power line ESDH-1 or the (1-2)-th power line ESDH-2 through the first transistor TR1.

The first transistor TR1 may include a first electrode, a second electrode, and a gate electrode. The first electrode of the first transistor TR1 may be connected to the (1-1)-th power line ESDH-1 or the (1-2)-th power line ESDH-2. The gate electrode of the first transistor TR1 may be connected to the (1-1)-th power line ESDH-1 or the (1-2)-th power line ESDH-2. In other words, the first transistor TR1 may be diode-connected. The second electrode of the first transistor TR1 may be connected to the data connection electrode DCN.

The data connection electrode DCN may be electrically connected to the second power line ESDL-1 through the second transistor TR2.

The second transistor TR2 may include a first electrode, a second electrode, and a gate electrode. The first electrode of the second transistor TR2 may be connected to the data connection electrode DCN. The gate electrode of the second transistor TR2 may be connected to the data connection electrode DCN. In other words, the second transistor TR2 may be diode-connected. The second electrode of the second transistor TR2 may be connected to the second power line ESDL-1.

In some embodiments, each of the first transistor TR1 and the second transistor TR2 may be a PMOS transistor. Accordingly, each active pattern of the first transistor TR1 and the second transistor TR2 may include a silicon semiconductor doped with cations. However, the present disclosure is not limited thereto, and each of the first transistor TR1 and the second transistor TR2 may be an NMOS transistor.

In some embodiments, the first transistor TR1 may include a (1-1)-th transistor TR1-1 and a (1-2)-th transistor TR1-2. The (1-1)-th transistor TR1-1 and the (1-2)-th transistor TR1-2 may be connected in series with each other. In other words, the first electrode and the gate electrode of the (1-1)-th transistor TR1-1 may be connected to the (1-1)-th power line ESDH-1 or the (1-2)-th power line ESDH-2, and the second electrode of the (1-1)-th transistor TR1-1 may be connected to the first electrode and the gate electrode of the (1-2)-th transistor TR1-2.

That is, by additionally disposing a transistor electrically connecting the (1-1)-th power line ESDH-1 and the data connection electrode DCN, the separation distance in a plan view between the (1-1)-th power line ESDH-1 and the data connection electrode DCN may be relatively increased. In other words, the (1-1-th power line ESDH-1 to which the first constant voltage is applied and the data connection electrode DCN to which the data voltage is applied may be spaced apart (e.g., separated/offset) by a set or predetermined distance. For example, a separation distance in a plan view between the (1-1)-th power line ESDH-1 and the data connection electrode DCN may be about 25 micrometers. Accordingly, corrosion defects that occur when the (1-1)-th power line ESDH-1 and the data connection electrode DCN are adjacent to each other may be suppressed or substantially reduced.

Similarly, by additionally disposing a transistor electrically connecting the (1-2)-th power line ESDH-2 and the data connection electrode DCN, the separation distance in a plan view between the (1-2)-th power line ESDH-2 and the data connection electrode DCN may be relatively increased.

In other words, the (1-2)-th power line ESDH-2 to which the first constant voltage is applied and the data connection electrode DCN to which the data voltage is applied may be spaced apart (e.g., separated/offset) by a set or predetermined distance. For example, a separation distance in a plan view between the (1-2)-th power lines ESDH-2 and the data connection electrode DCN may be about 25 micrometers. Accordingly, corrosion defects that occur when the (1-2)-th power line ESDH-2 and the data connection electrode DCN are adjacent to each other may be suppressed or substantially reduced.

In addition, the second transistor TR2 may include a (2-1)-th transistor TR2-1 and a (2-2)-th transistor TR2-2. The (2-1)-th transistor TR2-1 and the (2-2)-th transistor TR2-2 may be connected in series with each other. In other words, the first electrode and the gate electrode of the (2-1)-th transistor TR2-1 may be connected to the data connection electrode DCN, and the second electrode of the (2-1)-th transistor TR2-1 may be connected to the first electrode and the gate electrode of the (2-2)-th transistor TR2-2.

That is, by additionally disposing a transistor electrically connecting the second power line ESDL-1 and the data connection electrode DCN, the separation distance in a plan view between the second power line ESDL-1 and the data connection electrode DCN may be relatively increased. In other words, the second power line ESDL-1 to which the second constant voltage is applied and the data connection electrode DCN to which the data voltage is applied may be spaced apart (e.g., separated/offset) by a set or predetermined distance. For example, a separation distance in a plan view between the second power line ESDL-1 and the data connection electrode DCN may be about 25 micrometers. Accordingly, corrosion defects that occur when the second power line ESDL-1 and the data connection electrode DCN are adjacent to each other may be suppressed or substantially reduced.

The separation distance in a plan view between the (1-1)-th power line ESDH-1 and the data connection electrode DCN and the separation distance between the second power line ESDL-1 and the data connection electrode DCN may be relatively increased. Accordingly, the separation distance D1 in a plan view between the (1-1)-th power line ESDH-1 and the second power line ESDL-1 may be relatively increased. For example, the separation distance D1 in a plan view between the (1-1)-th power line ESDH-1 and the second power line ESDL-1 may be about 50 micrometers.

Similarly, the separation distance in a plan view between the (1-2)-th power line ESDH-2 and the data connection electrode DCN and the separation distance in a plan view between the second power line ESDL-1 and the data connection electrode DCN may be relatively increased. Accordingly, the separation distance D2 in a plan view between the (1-2)-th power line ESDH-2 and the second power line ESDL-1 may be relatively increased. For example, the separation distance D2 in a plan view between the (1-2)-th power line ESDH-2 and the second power line ESDL-1 may be about 50 micrometers.

That is, the (1-1)-th power line ESDH-1 to which the first constant voltage is applied and the second power line ESDL-1 to which the second constant voltage is applied may be spaced apart (e.g., separated/offset) by a set or predetermined distance. In addition, the (1-2)-th power line ESDH-2 to which the first constant voltage is applied and the second power line ESDL-1 to which the second constant voltage is applied may be spaced apart by a set or predetermined distance. Accordingly, corrosion defects that occur when the (1-1)-th power line ESDH-1 and (1-2)-th power line ESDH-2 are adjacent to the second power line ESDL-1 may be suppressed or substantially reduced.

In some embodiments, the first constant voltage may have a positive voltage level, and the second constant voltage may be a ground voltage. In this case, compared to a case where the second constant voltage has a negative voltage level, a potential difference between the first constant voltage and the second constant voltage may be relatively reduced. Accordingly, corrosion defects of the lines, which may occur when a potential difference between adjacent lines is large, may be effectively suppressed or substantially reduced.

Figure 8:
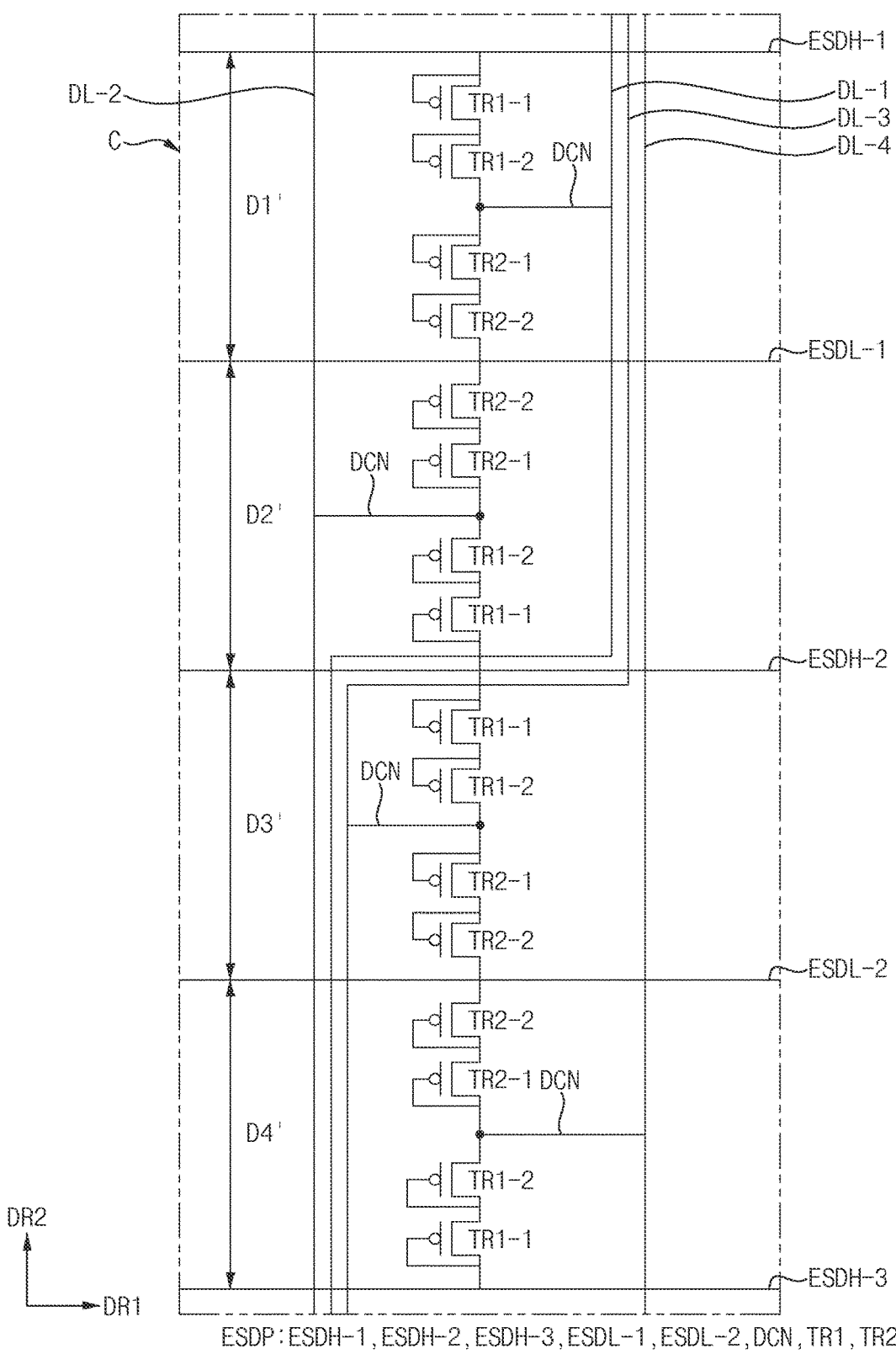
FIG. 8 is an enlarged plan view of the area 'C' of FIG. 7, according to some embodiments of the present disclosure.

FIG. 7 is a plan view illustrating a display device according to some other embodiments of the present disclosure. FIG. 8 is an enlarged plan view of the area 'C' of FIG. 7, according to some embodiments of the present disclosure.

Referring to FIGS. 7 and 8, a display device DD2 may include the substrate SUB, the test line part TP, an electrostatic protection part ESDP, the driving chip IC, the pad part PDP, the high voltage line VGHL, the low voltage line VGLL, and data lines DL in the pad area (e.g., the pad area PDA of FIG. 1).

The display device DD2 may be substantially the same as the display device DD provided with reference to FIGS. 1 to 6, except for the electrostatic protection part ESDP and the data lines DL. Hereinafter, descriptions overlapping descriptions of the display device DD provided with reference to FIGS. 1 to 6 will be omitted or simplified.

The test line part TP may be disposed on the substrate SUB in the pad area and may extend along the first direction DR1. For example, the test line part TP may be adjacent to the bending area (e.g., the bending area of FIG. 1). The test line part TP may receive a first constant voltage from the high voltage line VGHL. The test line part TP may include the first test line TL1 and the second test line TL2.

The electrostatic protection part ESDP may be disposed on the substrate SUB in the pad area. The electrostatic protection part ESDP may be adjacent to the test line part TP in the second direction DR2. For example, the electrostatic protection part ESDP may be disposed between the test line part TP and the pad part PDP in a plan view. The electrostatic protection part ESDP may include a (1-1)-th power line ESDH-1, a (1-2)-th power line ESDH-2, a (1-3)-th power line ESDH-3, a (2-1)-th power line ESDL-1, and a (2-2)-th power line ESDL-2.

The (1-1)-th power line ESDH-1 may be disposed on the substrate SUB in the pad area and may extend along the first direction DR1. The (1-1)-th power line ESDH-1 may receive the first constant voltage from the high voltage line VGHL.

The (1-1)-th power line ESDH-1 may be adjacent to the test line part TP in the second direction DR2. For example, the (1-1)-th power line ESDH-1 may be disposed between the first test line TL1 and the (2-1)-th power line ESDL-1 in a plan view. Accordingly, the test line part TP to which the first constant voltage is applied and the (1-1)-th power line ESDH-1 to which the first constant voltage is applied may be disposed adjacent to each other.

The (2-1)-th power line ESDL-1 may be disposed on the substrate SUB in the pad area and may extend along the first direction DR1. The (2-1)-th power line ESDL-1 may receive a second constant voltage, which is different from the first constant voltage, from the low voltage line VGLL. In some embodiments, the first constant voltage may have a positive voltage level, and the second constant voltage may have a negative voltage level.

The (2-1)-th power line ESDL-1 may be disposed between the (1-1)-th power line ESDH-1 and the pad part PDP in a plan view. In other words, the (2-1)-th power line ESDL-1 may be disposed between the (1-1)-th power line ESDH-1 and a plurality of pads in a plan view. For example, the (2-1)-th power line ESDL-1 may be disposed between the (1-1)-th power line ESDH-1 and the (1-2)-th power line ESDH-2 in a plan view. Accordingly, the test line part TP to which the first constant voltage is applied and the (2-1)-th power line ESDL-1 to which the second constant voltage is applied may be spaced apart (e.g., separated/offset) by a set or predetermined distance. Accordingly, corrosion defects that occur when the test line part TP and the (2-1)-th power line ESDL-1 are adjacent to each other may be suppressed or substantially reduced.

The (1-2)-th power line ESDH-2 may be disposed on the substrate SUB in the pad area and may extend along the first direction DR1. The (1-2)-th power line ESDH-2 may receive the first constant voltage from the high voltage line VGHL.

The (1-2)-th power line ESDH-2 may be disposed between the (2-1)-th power line ESDL-1 and the pad part PDP in a plan view. That is, the (1-2)-th power line ESDH-2 may be disposed between the (2-1)-th power line ESDL-1 and the plurality of pads in a plan view. For example, the (1-2)-th power line ESDH-2 may be disposed between the (2-1)-th power line ESDL-1 and the (2-2)-th power line ESDL-2 in a plan view.

The (2-2)-th power line ESDL-2 may be disposed on the substrate SUB in the pad area and may extend along the first direction DR1. The (2-2)-th power line ESDL-2 may receive the second constant voltage from the low voltage line VGLL.

The (2-2)-th power line ESDL-2 may be disposed between the (1-2)-th power line ESDH-2 and the pad part PDP in a plan view. That is, the (2-2)-th power line ESDL-2 may be disposed between the (1-2)-th power line ESDH-2 and the plurality of pads in a plan view. For example, the (2-2)-th power line ESDL-2 may be disposed between the (1-2)-th power line ESDH-2 and the (1-3)-th power line ESDH-3 in a plan view.

The (1-3)-th power line ESDH-3 may be disposed on the substrate SUB in the pad area and may extend along the first direction DR1. The (1-3)-th power line ESDH-3 may receive the first constant voltage from the high voltage line VGHL.

The (1-3)-th power line ESDH-3 may be disposed between the (2-2)-th power line ESDL-2 and the pad part PDP in a plan view. That is, the (1-3)-th power line ESDH-3 may be disposed between the (2-2)-th power line ESDL-2 and the plurality of pads in a plan view.

That is, the electrostatic protection part ESDP may be arranged in an order of the (1-3)-th power line ESDH-3, the (2-2)-th power line ESDL-2, the (1-2)-th power line ESDH-2, the (2-1)-th power line ESDL-1, and the (1-1)-th power line ESDH-1 along the second direction DR2 from the pad part PDP.

The data lines DL may be disposed on the substrate SUB in the pad area. The data lines DL may extend along the second direction DR2 and may be disposed side-by-side along the first direction DR1. The data lines DL may receive a data voltage from the driving chip IC.

As illustrated in FIG. 8, the data lines DL may include first data lines DL-1, second data lines DL-2, third data lines DL-3, and fourth data lines DL-4. In addition, the electrostatic protection part ESDP may further include a data connection electrode DCN, a first transistor TR1 and a second transistor TR2.

The data connection electrode DCN may be disposed on the substrate SUB in the pad area. The data connection electrode DCN may be electrically connected to each of the data lines DL. Accordingly, the data connection electrode DCN may receive the data voltage from each of the data lines DL.

Each of the first data lines DL-1 may be electrically connected to the (1-1)-th power line ESDH-1 through the data connection electrode DCN. In addition, each of the first data lines DL-1 may be electrically connected to the (2-1)-th power line ESDL-1 through the data connection electrode DCN.

Each of the second data lines DL-2 may be electrically connected to the (1-2)-th power line ESDH-2 through the data connection electrode DCN. In addition, each of the second data lines DL-2 may be electrically connected to the (2-1)-th power line ESDL-1 through the data connection electrode DCN.

Each of the third data lines DL-3 may be electrically connected to the (1-2)-th power line ESDH-2 through the data connection electrode DCN. In addition, each of the third data lines DL-3 may be electrically connected to the (2-2)-th power line ESDL-2 through the data connection electrode DCN.

Each of the fourth data lines DL-4 may be electrically connected to the (1-3)-th power line ESDH-3 through the data connection electrode DCN. In addition, each of the fourth data lines DL-4 may be electrically connected to the (2-2)-th power line ESDL-2 through the data connection electrode DCN.

The data connection electrode DCN may be electrically connected to one of the (1-1)-th power line ESDH-1, the (1-2)-th power line ESDH-2, and the (1-3)-th power line ESDH-3 through the first transistor TR1.

The first transistor TR1 may include a first electrode, a second electrode, and a gate electrode. The first electrode of the first transistor TR1 may be connected to one of the (1-1)-th power line ESDH-1, the (1-2)-th power line ESDH-2, and the (1-3)-th power line ESDH-3. The gate electrode of the first transistor TR1 may be connected to one of the (1-1)-th power line ESDH-1, the (1-2)-th power line ESDH-2, and the (1-3)-th power line ESDH-3. That is, the first transistor TR1 may be diode-connected. The second electrode of the first transistor TR1 may be connected to the data connection electrode DCN.

The data connection electrode DCN may be electrically connected to the (2-1)-th power line ESDL-1 or the (2-2)-th power line ESDL-2 through the second transistor TR2.

The second transistor TR2 may include a first electrode, a second electrode, and a gate electrode. The first electrode of the second transistor TR2 may be connected to the data connection electrode DCN. The gate electrode of the second transistor TR2 may be connected to the data connection electrode DCN. That is, the second transistor TR2 may be diode-connected. The second electrode of the second transistor TR2 may be connected to the (2-1)-th power line ESDL-1 or the (2-2)-th power line ESDL-2.

In some embodiments, the first transistor TR1 may include a (1-1)-th transistor TR1-1 and a (1-2)-th transistor TR1-2. The (1-1)-th transistor TR1-1 and the (1-2)-th transistor TR1-2 may be connected in series with each other. Accordingly, the separation distance in a plan view between the (1-1)-th power line ESDH-1 and the data connection electrode DCN may be relatively increased; the separation distance in a plan view between the (1-2)-th power line ESDH-2 and the data connection electrode DCN may be relatively increased; and the separation distance in a plan view between the (1-3)-th power line ESDH-3 and the data connection electrode DCN may also be relatively increased.

In addition, the second transistor TR2 may include a (2-1)-th transistor TR2-1 and a (2-2)-th transistor TR2-2. The (2-1)-th transistor TR2-1 and the (2-2)-th transistor TR2-2 may be connected in series (e.g., electrically in series) with each other. Accordingly, the separation distance in a plan view between the (2-1)-th power line ESDL-1 and the data connection electrode DCN may be relatively increased. The separation distance in a plan view between the (2-2)-th power line ESDL-2 and the data connection electrode DCN may be relatively increased.

A separation distance D1' in a plan view between the (1-1)-th power line ESDH-1 and the (2-1)-th power line ESDL-1 may be relatively increased. For example, the separation distance D1' in a plan view between the (1-1)-th power line ESDH-1 and the (2-1)-th power line ESDL-1 may be about 50 micrometers.

A separation distance D2' in a plan view between the (2-1)-th power line ESDL-1 and the (1-2)-th power line ESDH-2 may be relatively increased. For example, the separation distance D2' in a plan view between the (2-1)-th power line ESDL-1 and the (1-2)-th power line ESDH-2 may be about 50 micrometers.

A separation distance D3' in a plan view between the (1-2)-th power line ESDH-2 and the (2-2)-th power line ESDL-2 may be relatively increased. For example, the separation distance D3' in a plan view between the (1-2)-th power line ESDH-2 and the (2-2)-th power line ESDL-2 may be about 50 micrometers.

A separation distance D4' in a plan view between the (2-2)-th power line ESDL-2 and the (1-3)-th power line ESDH-3 may be relatively increased. For example, the separation distance D4' in a plan view between the (2-2)-th power line ESDL-2 and the (1-3)-th power line ESDH-3 may be about 50 micrometers.

In some embodiments, the first constant voltage may have a positive voltage level, and the second constant voltage may be a ground voltage. Accordingly, corrosion defects of the lines, which may occur when a potential difference between adjacent lines is large, may be effectively suppressed or substantially reduced.

Figure 9:
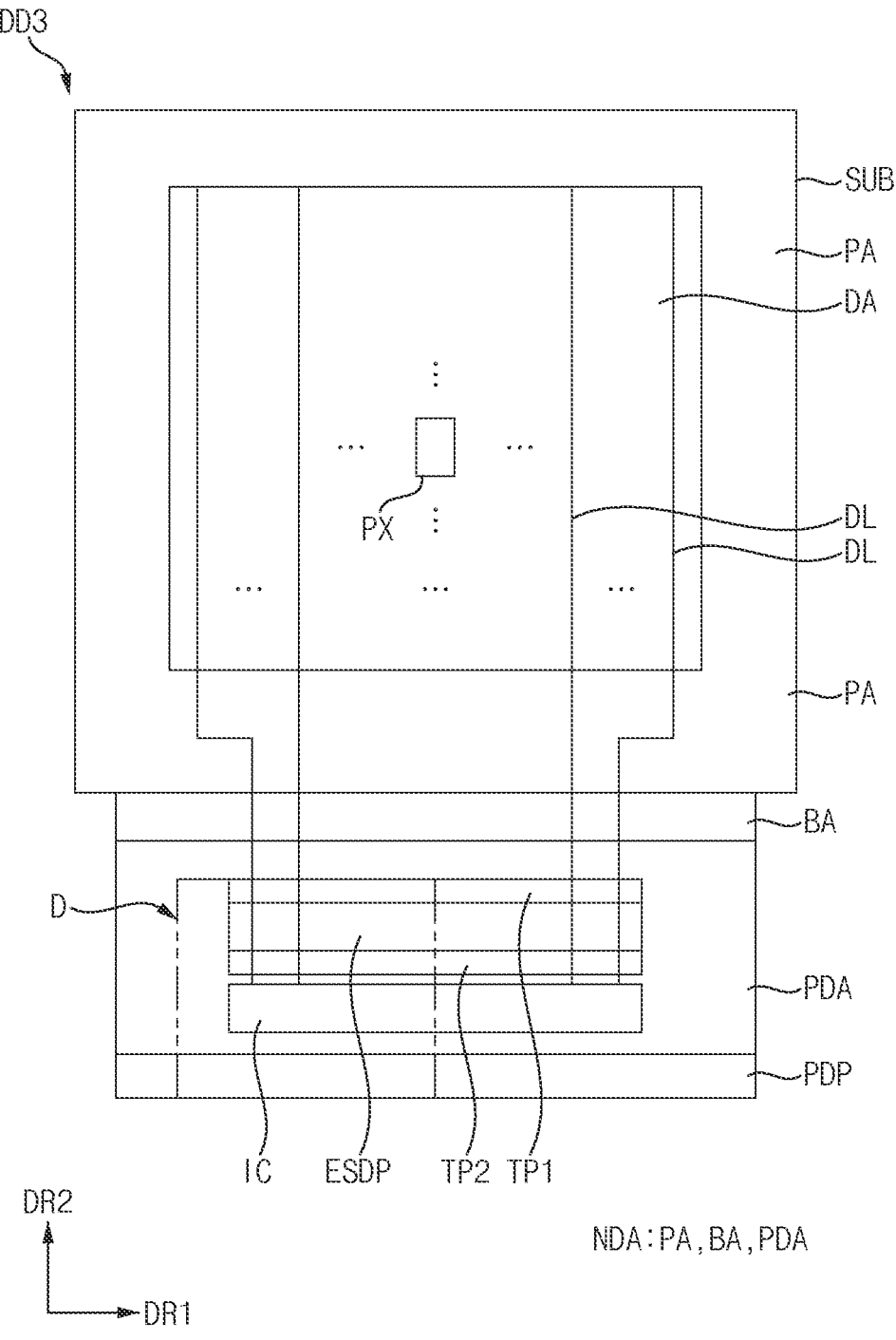
FIG. 9 is a plan view illustrating a display device according to still other embodiments of the present disclosure.
Figure 10:
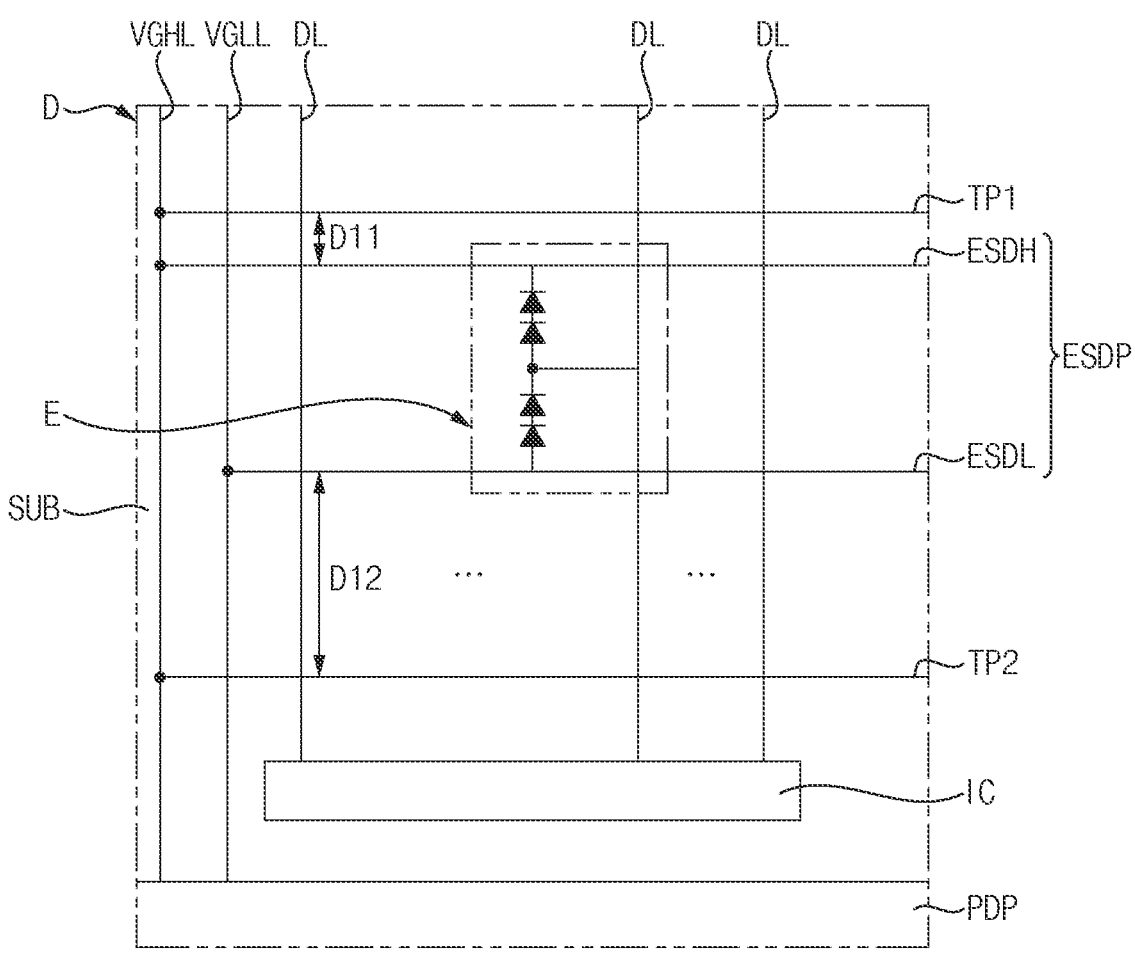
FIG. 10 is an enlarged plan view of the area 'D' of FIG. 9, according to some embodiments of the present disclosure.
Figure 10:
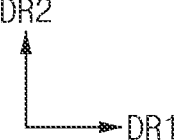
Figure 11:
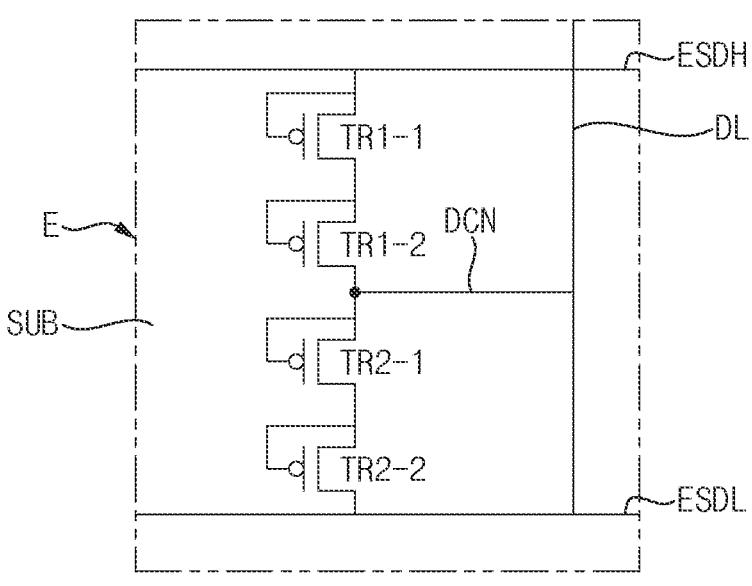
FIG. 11 is an enlarged plan view of the area 'E' of FIG. 10, according to some embodiments of the present disclosure.

FIG. 9 is a plan view illustrating a display device according to still other embodiments of the present disclosure. FIG. 10 is an enlarged plan view of the area 'D' of FIG. 9, according to some embodiments of the present disclosure. FIG. 11 is an enlarged plan view of the area 'E' of FIG. 10, according to some embodiments of the present disclosure.

Referring to FIG. 9, a display device DD3 may include the substrate SUB, a first test line part TP1, a second test line part TP2, an electrostatic protection part ESDP, the driving chip IC, the pad part PDP, and the data lines DL.

The display device DD3 may be substantially the same as the display device DD described with reference to FIGS. 1 to 6, except for the first test line part TP1, the second test line part TP2, and the electrostatic protection part ESDP. Hereinafter, descriptions overlapping descriptions of the display device DD provided with reference to FIGS. 1 to 6 will be omitted or simplified.

The first test line part TP1 may be disposed on the substrate SUB in the pad area PDA. For example, the first test line part TP1 may be adjacent to the bending area BA. The first test line part TP1 may extend along the first direction DR1.

The second test line part TP2 may be disposed on the substrate SUB in the pad area PDA. For example, the second test line part TP2 may be adjacent to the pad part PDP. In addition, the second test line part TP2 may be spaced apart (e.g., separated/offset) from the first test line part TP1 in the second direction DR2. The second test line part TP2 may extend along the first direction DR1.

For example, the first test line part TP1 and the second test line part TP2 may include lines for inspecting (e.g., identifying) defects such as cracks occurring at the non-display area NDA. However, the present disclosure is not limited thereto, and the first test line part TP1 and the second test line part TP2 may include various lines for inspecting defects of the display device DD3.

The electrostatic protection part ESDP may be disposed on the substrate SUB in the pad area PDA. The electrostatic protection part ESDP may be adjacent to the first test line part TP1 in the second direction DR2. For example, the electrostatic protection part ESDP may be disposed between the first test line part TP1 and the second test line part TP2 in a plan view.

In some embodiments, the display device DD3 may be a smart watch. The smart watch may refer to a device in which communication and computing functions are combined with a watch. However, the present disclosure is not limited thereto.

Referring further to FIGS. 10 and 11, the display device DD3 may include the substrate SUB, the first test line part TP1, the second test line part TP2, the electrostatic protection part ESDP, the driving chip IC, the pad part PDP, the high voltage line VGHL, the low voltage line VGLL, and the data lines DL in the pad area PDA.

The first test line part TP1 may be disposed on the substrate SUB in the pad area PDA and may extend along the first direction DR1. For example, the first test line part TP1 may be adjacent to the bending area BA. The first test line part TP1 may receive a first constant voltage from the high voltage line VGHL.

The electrostatic protection part ESDP may be disposed on the substrate SUB in the pad area PDA. The electrostatic protection part ESDP may be adjacent to the first test line part TP1 in the second direction DR2. For example, the electrostatic protection part ESDP may be disposed between the first test line part TP1 and the second test line part TP2 in a plan view. The electrostatic protection part ESDP may include a first power line ESDH and a second power line ESDL.

The first power line ESDH may be disposed on the substrate SUB in the pad area PDA and may extend along the first direction DR1. The first power line ESDH may receive the first constant voltage from the high voltage line VGHL.

The first power line ESDH may be adjacent to the first test line part TP1 in the second direction DR2. For example, the first power line ESDH may be disposed between the first test line part TP1 and the second power line ESDL in a plan view. The first test line part TP1 to which the first constant voltage is applied and the first power line ESDH to which the first constant voltage is applied may be disposed adjacent to each other.

The second power line ESDL may be disposed on the substrate SUB in the pad area PDA and may extend along the first direction DR1. The second power line ESDL may receive a second constant voltage, which is different from the first constant voltage, from the low voltage line VGLL. In some embodiments, the first constant voltage may have a positive voltage level, and the second constant voltage may have a negative voltage level.

The second power line ESDL may be disposed between the first power line ESDH and the pad part PDP in a plan view. That is, the second power line ESDL may be disposed between the first power line ESDH and a plurality of pads in a plan view. For example, the second power line ESDL may be disposed between the first power line ESDH and the second test line part TP2 in a plan view.

The second test line part TP2 may be disposed on the substrate SUB in the pad area PDA and may extend along the first direction DR1. The second test line part TP2 may receive the first constant voltage from the high voltage line VGHL.

The second test line part TP2 may be adjacent to the pad part PDP. The second test line part TP2 may be disposed between the second power line ESDL and the pad part PDP in a plan view. That is, the second test line part TP2 may be disposed between the second power line ESDL and the plurality of pads in a plan view.

The second power line ESDL may be spaced apart (e.g., separated/offset) from the second test line part TP2 by a set or predetermined distance. In other words, the second power line ESDL to which the second constant voltage is applied may be spaced apart (e.g., separated/offset) from the second test line part TP2 to which the first constant voltage is applied by a set or predetermined distance. For example, a separation distance D12 in a plan view between the second test line part TP2 and the second power line ESDL may be about 30 micrometers. Accordingly, corrosion defects of lines, which may occur when a potential difference between adjacent lines is large, may be suppressed or substantially reduced.

In some embodiments, the separation distance D12 in a plan view between the second test line part TP2 and the second power line ESDL may be greater than a separation distance D11 in a plan view between the first test line part TP1 and the first power line ESDH.

The data lines DL may be disposed on the substrate SUB in the pad area PDA. The data lines DL may extend along the second direction DR2 and may be disposed along the first direction DR1. The data lines DL may receive a data voltage from the driving chip IC.

As illustrated in FIG. 11, the electrostatic protection part ESDP may further include a data connection electrode DCN, a first transistor TR1, and a second transistor TR2.

The data connection electrode DCN may be disposed on the substrate SUB in the pad area PDA. The data connection electrode DCN may be electrically connected to each of the data lines DL. Accordingly, the data connection electrode DCN may receive the data voltage from each of the data lines DL.

Each of the data lines DL may be electrically connected to the first power line ESDH through the data connection electrode DCN. In addition, each of the data lines DL may be electrically connected to the second power line ESDL through the data connection electrode DCN.

The data connection electrode DCN may be electrically connected to the first power line ESDH through the first transistor TR1.

The first transistor TR1 may include a first electrode, a second electrode, and a gate electrode. The first electrode of the first transistor TR1 may be connected to the first power line ESDH. The gate electrode of the first transistor TR1 may be connected to the first power line ESDH. That is, the first transistor TR1 may be diode-connected. The second electrode of the first transistor TR1 may be connected to the data connection electrode DCN.

The data connection electrode DCN may be electrically connected to the second power line ESDL through the second transistor TR2.

The second transistor TR2 may include a first electrode, a second electrode, and a gate electrode. The first electrode of the second transistor TR2 may be connected to the data connection electrode DCN. The gate electrode of the second transistor TR2 may be connected to the data connection electrode DCN. That is, the second transistor TR2 may be diode-connected. The second electrode of the second transistor TR2 may be connected to the second power line ESDL.

In some embodiments, the first transistor TR1 may include a (1-1)-th transistor TR1-1 and a (1-2)-th transistor TR1-2. The (1-1)-th transistor TR1-1 and the (1-2)-th transistor TR1-2 may be connected in series with each other. Accordingly, a separation distance in a plan view between the first power line ESDH and the data connection electrode DCN may be relatively increased.

In addition, the second transistor TR2 may include a (2-1)-th transistor TR2-1 and a (2-2)-th transistor TR2-2. The (2-1)-th transistor TR2-1 and the (2-2)-th transistor TR2-2 may be connected in series with each other. Accordingly, a separation distance in a plan view between the second power line ESDL and the data connection electrode DCN may be relatively increased.

In addition, a separation distance in a plan view between the first power line ESDH and the second power line ESDL may be relatively increased. For example, the separation distance in a plan view between the first power line ESDH and the second power line ESDL may be about 50 micrometers.

In some embodiments, the first constant voltage may have a positive voltage level, and the second constant voltage may be a ground voltage. Accordingly, corrosion defects of the lines, which may occur when a potential difference between adjacent lines is large, may be effectively suppressed or substantially reduced.

The present disclosure can be applied to various display devices. For example, the present disclosure is applicable to various display devices such as display devices for vehicles, ships and aircraft, portable communication devices, display devices for exhibition or information transmission, medical display devices, and the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of the embodiments of the present disclosure, and is not to be construed as limiting thereof. Although a few embodiments have been described with reference to the figures, those skilled in the art will readily appreciate that many variations and modifications may be made therein without departing from the spirit and scope of the present disclosure as defined by the appended claims, and equivalents thereof.

What is claimed is:

1. A display device comprising:
a substrate comprising a display area, a pad area where a plurality of pads are positioned, and a bending area positioned between the display area and the pad area in a plan view;
a test line part on the substrate in the pad area adjacent to the bending area, extending along a first direction, and to which a first constant voltage is applied;
a (1-1)-th power line on the substrate in the pad area, adjacent to the test line part in a second direction crossing the first direction, extending along the first direction, and to which the first constant voltage is applied;
a (2-1)-th power line between the (1-1)-th power line and the plurality of pads in the plan view, extending along the first direction, and to which a second constant voltage different from the first constant voltage is applied; and
a (1-2)-th power line between the (2-1)-th power line and the plurality of pads in the plan view, extending along the first direction, and to which the first constant voltage is applied.

2. The display device of claim 1, wherein the first constant voltage has a positive voltage level, and
wherein the second constant voltage has a negative voltage level.

3. The display device of claim 1, further comprising:
a data line on the substrate in the display area and extending along the second direction; and
a connection electrode connecting the data line and one of the (1-1)-th power line and the (1-2)-th power line, and connecting the data line and the (2-1)-th power line.

4. The display device of claim 3, wherein the connection electrode is connected to the (1-1)-th power line or the (1-2)-th power line through a first transistor, and is connected to the (2-1)-th power line through a second transistor.

5. The display device of claim 4, wherein the first transistor comprises a first electrode connected to the (1-1)-th power line or the (1-2)-th power line, a gate electrode connected to the (1-1)-th power line or the (1-2)-th power line, and a second electrode connected to the connection electrode, and
wherein the second transistor comprises a first electrode connected to the connection electrode, a gate electrode connected to the connection electrode, and a second electrode connected to the (2-1)-th power line.

6. The display device of claim 5, wherein the first transistor comprises a (1-1)-th transistor and a (1-2)-th transistor,
wherein the second transistor comprises a (2-1)-th transistor and a (2-2)-th transistor,
wherein the (1-1)-th transistor and the (1-2)-th transistor are connected in series with each other, and
wherein the (2-1)-th transistor and the (2-2)-th transistor are connected in series with each other.

7. The display device of claim 1, wherein the first constant voltage has a positive voltage level, and
wherein the second constant voltage is a ground voltage.

8. The display device of claim 1, further comprising:

a (2-2)-th power line between the (1-2)-th power line and the plurality of pads in the plan view, extending along the first direction, and to which the second constant voltage is applied; and a (1-3)-th power line between the (2-2)-th power line and the plurality of pads in the plan view, extending along the first direction, and to which the first constant voltage is applied.

9. The display device of claim 8, wherein the first constant voltage has a positive voltage level, and wherein the second constant voltage has a negative voltage level.

10. The display device of claim 8, further comprising:

a data line on the substrate in the display area and extending along the second direction; and a connection electrode connecting the data line to one of the (1-1)-th power line, the (1-2)-th power line, and the (1-3)-th power line, and connecting the data line to one of the (2-1)-th power line and the (2-2)-th power line.

11. The display device of claim 10, wherein the connection electrode is connected to one of the (1-1)-th power line, the (1-2)-th power line, and the (1-3)-th power line through a first transistor and is connected to the (2-1)-th power line or the (2-2)-th power line through a second transistor.

12. The display device of claim 11, wherein the first transistor comprises a first electrode connected to one of the (1-1)-th power line, the (1-2)-th power line, and the (1-3)-th power line, a gate electrode connected to one of the (1-1)-th power line, the (1-2)-th power line, and the (1-3)-th power line, and a second electrode connected to the connection electrode, and wherein the second transistor comprises a first electrode connected to the connection electrode, a gate electrode connected to the connection electrode, and a second electrode connected to the (2-1)-th power line or the (2-2)-th power line.

13. The display device of claim 12, wherein the first transistor comprises a (1-1)-th transistor and a (1-2)-th transistor, wherein the second transistor comprises a (2-1)-th transistor and a (2-2)-th transistor, wherein the (1-1)-th transistor and the (1-2)-th transistor are connected in series with each other, and wherein the (2-1)-th transistor and the (2-2)-th transistor are connected in series with each other.

14. The display device of claim 8, wherein the first constant voltage has a positive voltage level, and wherein the second constant voltage is a ground voltage.

15. A display device comprising:

a substrate comprising a display area, a pad area where a plurality of pads are positioned, and a bending area positioned between the display area and the pad area in a plan view;

a first test line part on the substrate in the pad area adjacent to the bending area, extending along a first direction, and to which a first constant voltage is applied;

a first power line on the substrate in the pad area, adjacent to the first test line part in a second direction crossing the first direction, extending along the first direction, and to which the first constant voltage is applied;

a second power line between the first power line and the plurality of pads in the plan view, extending along the first direction, and to which a second constant voltage different from the first constant voltage is applied;

a second test line part between the second power line and the plurality of pads in the plan view, extending along the first direction, and to which the first constant voltage is applied;

a data line on the substrate in the display area and extending along the second direction; and a connection electrode connecting the data line and the first power line, and connecting the data line and the second power line.

16. The display device of claim 15, wherein the connection electrode is connected to the first power line through a first transistor and is connected to the second power line through a second transistor, wherein the first transistor comprises a (1-1)-th transistor and a (1-2)-th transistor, wherein the second transistor comprises a (2-1)-th transistor and a (2-2)-th transistor, wherein the (1-1)-th transistor and the (1-2)-th transistor are connected in series with each other, and wherein the (2-1)-th transistor and the (2-2)-th transistor are connected in series with each other.

17. The display device of claim 16, wherein the first transistor comprises a first electrode connected to the first power line, a gate electrode connected to the first power line, and a second electrode connected to the connection electrode, and wherein the second transistor comprises a first electrode connected to the connection electrode, a gate electrode connected to the connection electrode, and a second electrode connected to the second power line.

18. The display device of claim 15, wherein a separation distance in the plan view between the second test line part and the second power line is greater than a separation distance in the plan view between the first test line part and the first power line.

19. The display device of claim 15, wherein the first constant voltage has a positive voltage level, and wherein the second constant voltage has a negative voltage level.

20. The display device of claim 15, wherein the first constant voltage has a positive voltage level, and wherein the second constant voltage is a ground voltage.

* * * * *